US009123674B2

(12) United States Patent
Yamakita

(10) Patent No.: US 9,123,674 B2
(45) Date of Patent: Sep. 1, 2015

(54) DISPLAY UNIT, METHOD OF MANUFACTURING DISPLAY UNIT, AND ELECTRONIC APPARATUS

(71) Applicant: Sony Corporation, Tokyo (JP)

(72) Inventor: Shigehiro Yamakita, Kanagawa (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/321,178

(22) Filed: Jul. 1, 2014

(65) Prior Publication Data
US 2015/0021571 A1     Jan. 22, 2015

(30) Foreign Application Priority Data

Jul. 19, 2013  (JP) ................................ 2013-150640

(51) Int. Cl.
| | | |
|---|---|---|
| H01L 51/52 | (2006.01) | |
| H01J 1/70 | (2006.01) | |
| G02F 1/167 | (2006.01) | |
| H01L 27/32 | (2006.01) | |
| H01L 51/56 | (2006.01) | |

(52) U.S. Cl.
CPC ........ H01L 27/3244 (2013.01); H01L 27/3279 (2013.01); H01L 51/525 (2013.01); H01L 51/5228 (2013.01); H01L 51/56 (2013.01); *H01L 27/322* (2013.01)

(58) Field of Classification Search
CPC ............ H01L 51/5228; H01L 51/5259; H01L 51/525; H01L 51/5203; H01L 51/56; H01L 27/3244; H01L 27/3279; H01L 27/322

USPC ................ 257/40, 59, 72, 350, 432, E51.018, 257/E51.022, E27.111, E27.119; 438/26, 438/35, 665; 359/296; 345/204; 313/512
See application file for complete search history.

(56) References Cited

U.S. PATENT DOCUMENTS

| | | | | |
|---|---|---|---|---|
| 7,474,061 | B2 * | 1/2009 | Oh et al. ..................... | 315/169.3 |
| 2010/0302614 | A1 * | 12/2010 | Peng et al. ................... | 359/230 |
| 2012/0025700 | A1 * | 2/2012 | Ryu et al. ..................... | 313/512 |
| 2012/0075261 | A1 * | 3/2012 | Ryu et al. ..................... | 345/204 |
| 2014/0097427 | A1 * | 4/2014 | Nakamura et al. .............. | 257/40 |

FOREIGN PATENT DOCUMENTS

| | | |
|---|---|---|
| JP | 2001-195008 | 7/2001 |
| JP | 4333333 | 9/2009 |
| JP | 2011-103205 | 5/2011 |

* cited by examiner

*Primary Examiner* — Dao H Nguyen
(74) *Attorney, Agent, or Firm* — K&L Gates LLP

(57) ABSTRACT

A display unit includes: a first substrate including a plurality of light-emission devices in a display region, the plurality of light-emission devices each including an organic layer between a first electrode and a second electrode; a second substrate disposed to face the first substrate with the light-emission devices interposed therebetween; a first peripheral electrode provided on the second substrate and positioned outside the display region; a first wiring provided on the second substrate and configured to be electrically connected to the first peripheral electrode; and a first connection section configured to electrically connect the first wiring and each of the light-emission devices.

23 Claims, 39 Drawing Sheets

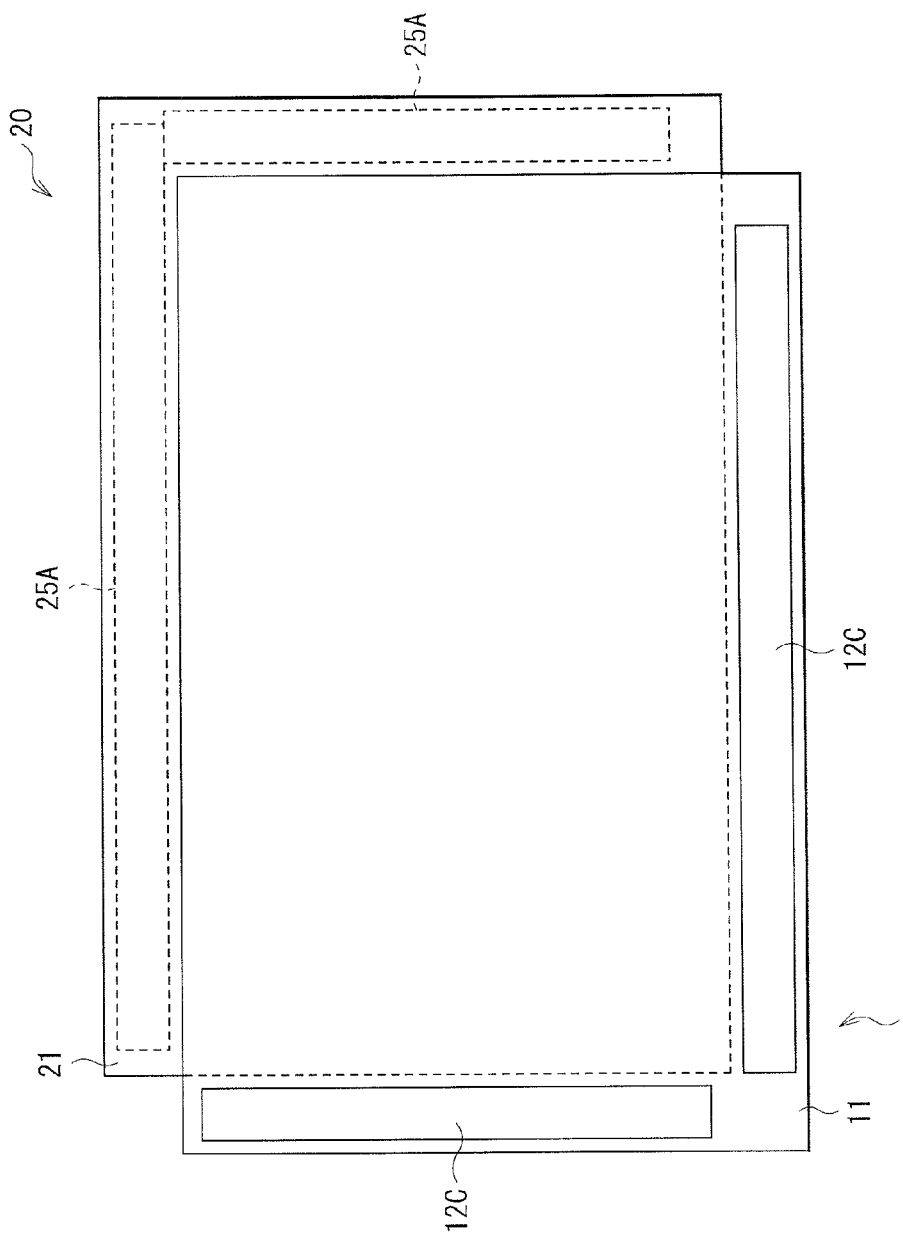

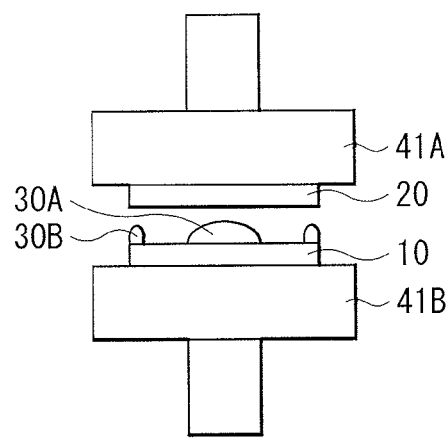
FIG. 21A
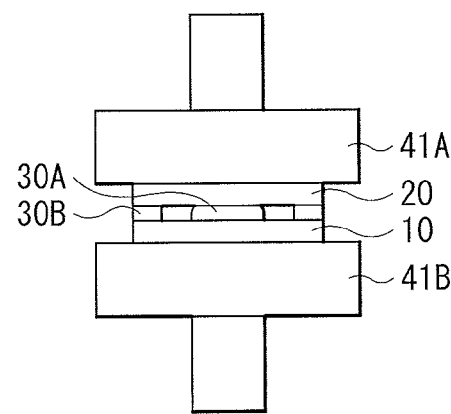
FIG. 21B
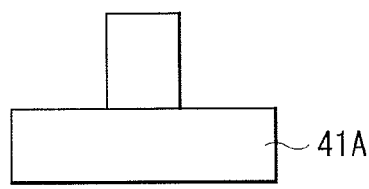
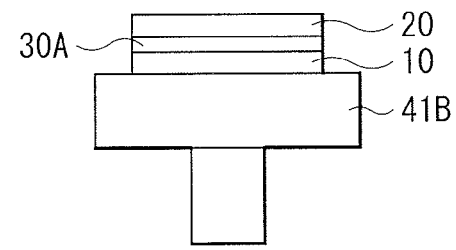
FIG. 21C

DISPLAY UNIT, METHOD OF MANUFACTURING DISPLAY UNIT, AND ELECTRONIC APPARATUS

CROSS REFERENCES TO RELATED APPLICATIONS

The present application claims priority to Japanese Priority Patent Application JP 2013-150640 filed in the Japan Patent Office on Jul. 19, 2013, the entire content of which is hereby incorporated by reference.

BACKGROUND

The present application relates to a display unit including a light-emission device such as an organic electroluminescence (EL) device, to a method of manufacturing the display unit, and to an electronic apparatus.

In recent years, as one type of flat-panel displays, displays using an organic EL device or the like have been receiving attention (for example, see Japanese Unexamined Patent Application Publication Nos. 2001-195008 and 2011-103205, as well as Japanese Patent No. 4333333). Such self-light-emitting-type displays have characteristics of low power consumption and wide viewing angle. Further, the organic EL device is considered to have sufficient responsivity to a high-definition high-speed video signal, and has been developed towards practical use. Such displays are mainly of an active matrix (AM) type, and each pixel may be controlled using, for example, a thin film transistor (TFT).

Meanwhile, self-light-emitting-type displays displaying colors are mainly manufactured by the following two methods. In a first method, organic layers of devices that each emit color of red, green, or blue are colored to have different colors. A color filter may be disposed in each of the pixels, to improve color purity. In a second method, an organic layer common to all light-emission devices is formed. In a display unit manufactured by this method, white light emitted by the light-emission devices are extracted, after being allowed to pass through color filters each having a color of red, green, or blue provided for the respective pixels. For example, light emitting layers of red, green, and blue may be laminated and provided as a common organic layer. Alternatively, light emitting layers of yellow and blue may be laminated and provided as a common organic layer. In the second method, it is not necessary to color the organic layers in different colors and therefore, the second method is easier than the above-described first method.

SUMMARY

However, the self-light-emitting-type displays are desired to be manufactured easily at a low cost.

It is desirable to provide a display unit capable of a further reduction in cost, and a method of manufacturing the display unit, and an electronic apparatus provided with the display unit.

According to an embodiment of the present application, there is provided a method of manufacturing a display unit, the method including: forming a plurality of light-emission devices in a display region on a first substrate, the plurality of light-emission devices each including an organic layer between a first electrode and a second electrode; forming a first wiring and a first peripheral electrode on a second substrate, the first peripheral electrode being provided outside the display region and being electrically connected to the first wiring; and disposing the second substrate to face the first substrate with the light-emission devices interposed therebetween, and electrically connecting the first wiring to each of the light-emission devices through the first connection section.

In the method of manufacturing the display unit according to the above-described embodiment of the present application, the first peripheral electrode is formed on the second substrate. Therefore, the number of masks to be used in forming the light-emission devices is allowed to be reduced. The first peripheral electrode may be electrically connected to, for example, the second electrode of the light-emission device through the first wiring and the first connection section.

According to an embodiment of the present application, there is provided a display unit including: a first substrate including a plurality of light-emission devices in a display region, the plurality of light-emission devices each including an organic layer between a first electrode and a second electrode; a second substrate disposed to face the first substrate with the light-emission devices interposed therebetween; a first peripheral electrode provided on the second substrate and positioned outside the display region; a first wiring provided on the second substrate and configured to be electrically connected to the first peripheral electrode; and a first connection section configured to electrically connect the first wiring and each of the light-emission devices.

According to an embodiment of the present application, there is provided an electronic apparatus including a display unit. The display unit includes: a first substrate including a plurality of light-emission devices in a display region, the plurality of light-emission devices each including an organic layer between a first electrode and a second electrode; a second substrate disposed to face the first substrate with the light-emission devices interposed therebetween; a first peripheral electrode provided on the second substrate and positioned outside the display region; a first wiring provided on the second substrate and configured to be electrically connected to the first peripheral electrode; and a first connection section configured to electrically connect the first wiring and each of the light-emission devices.

According to the display unit, the method of manufacturing the display unit, and the electronic apparatus of the above-described embodiments of the present application, the first peripheral electrode is provided on the second substrate. Therefore, the number of masks to be used in forming the light-emission devices is allowed to be reduced. Accordingly, for example, an increase in running cost due to use of the masks is allowed to be suppressed, which enables manufacturing at a low cost.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the present application, and are incorporated in and constitute a part of this specification. The drawings illustrate embodiments and, together with the specification, serve to describe the principles of the technology.

FIG. 7 is a plan view illustrating a state in which the device panel illustrated in FIG. 5 and the sealing panel illustrated in FIG. 6 are disposed to overlap each other.

FIG. 21A is a cross-sectional diagram illustrating an example of a process of adhering the device panel illustrated in FIG. 8D and the sealing panel illustrated in FIG. 20B to each other.

FIG. 21B is a cross-sectional diagram illustrating a process following the process in FIG. 21A.

FIG. 21C is a cross-sectional diagram illustrating a process following the process in FIG. 21B.

DETAILED DESCRIPTION

Some embodiments of the present application will be described below in detail with reference to the drawings. It is to be noted that the description will be provided in the following order.

1. First embodiment (a display unit having a first peripheral electrode on a second substrate: top emission type)
2. Modification 1 (an example in which a first connection section is configured of a conductive ball)
3. Modification 2 (an example in which the first connection section is configured of conductive resin)
4. Modification 3 (an example in which the first connection section is configured of a projection section of a color filter)
5. Modification 4 (an example in which the first connection section is configured of a projection section of an insulating film)
6. Second embodiment (a display unit including a first peripheral electrode and a second peripheral electrode on a second substrate)
7. Third embodiment (a display unit of a bottom emission type)

First Embodiment

Overall Configuration of Display Unit

Figure 1:
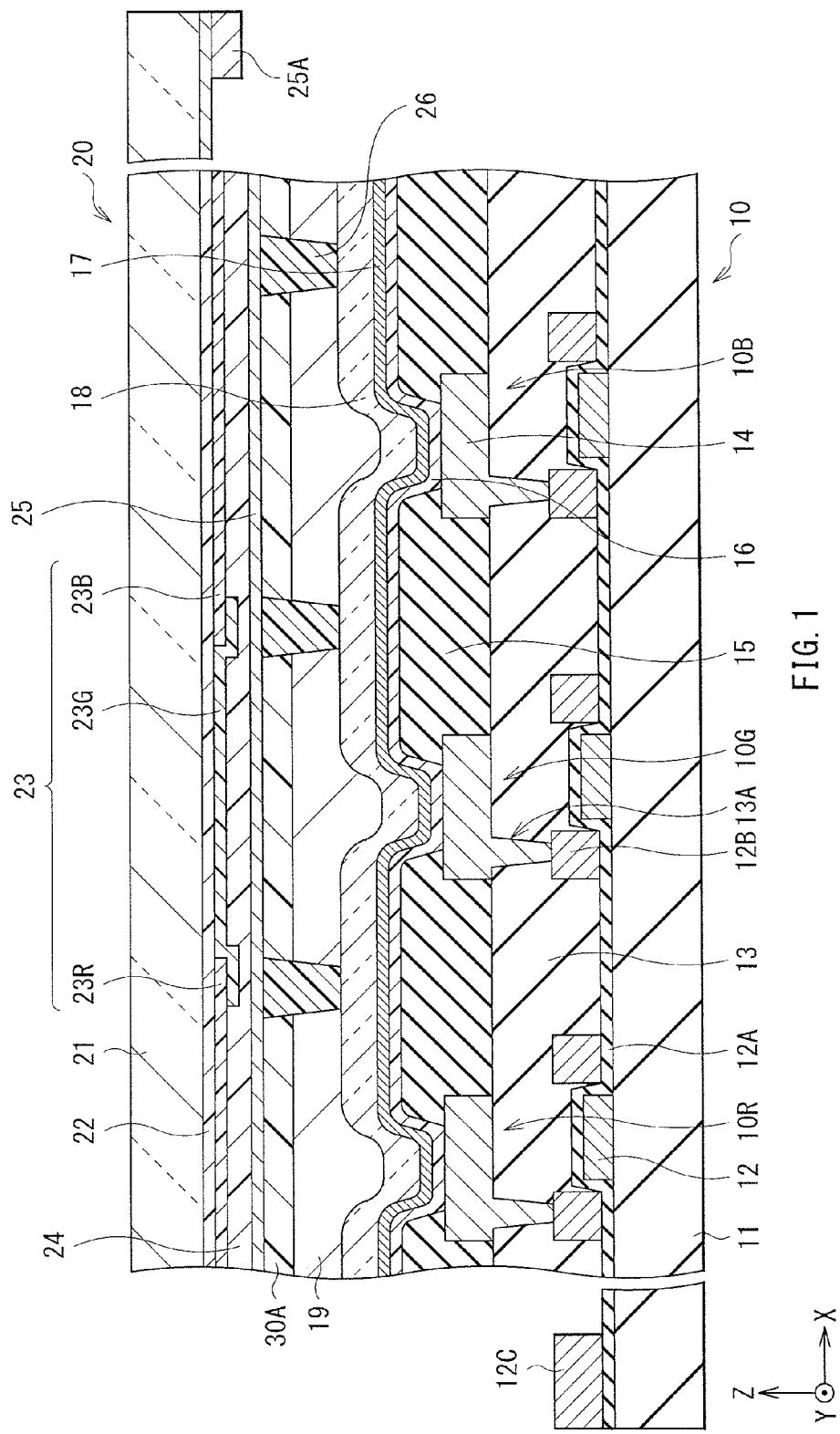
FIG. 1 is a cross-sectional diagram illustrating a configuration of a display unit according to a first embodiment of the present application.

FIG. 1 illustrates a cross-sectional configuration of an organic EL display unit (a display unit 1) according to a first embodiment of the present application. The display unit 1 includes a device panel 10 and a sealing panel 20. The display unit 1 is a so-called top-emission-type display unit, and has a light extraction direction towards the sealing panel 20 side. A filling resin 30A is provided between the device panel 10 and the sealing panel 20. The device panel 10 includes an organic light-emission device 10R generating red light, an organic light-emission device 10G generating green light, and an organic light-emission device 10B generating blue light, which are provided on a device substrate 11 (a first substrate). A thin-film transistor (TFT) 12 and a flattening layer 13 are provided between the device substrate 11 and the organic light-emission devices 10R, 10G, and 10B. The organic light-emission devices 10R, 10G, and 10B are covered with a protective layer 19. The sealing panel 20 includes a sealing substrate 21 (a second substrate) disposed to face the device substrate 11. On a surface, of the sealing substrate 21, that faces the device substrate 11, a light-shielding layer 22, a color filter 23, an overcoat layer 24, an auxiliary wiring 25, and a pillar 26 (a first connection section) are provided in this order from the sealing substrate 21 side. In the display unit 1, the auxiliary wiring 25 (a first wiring) of the sealing panel 20 and the organic light-emission devices 10R, 10G, and 10B of the device panel 10 are electrically connected to each other through the pillar 26.

Figure 2:
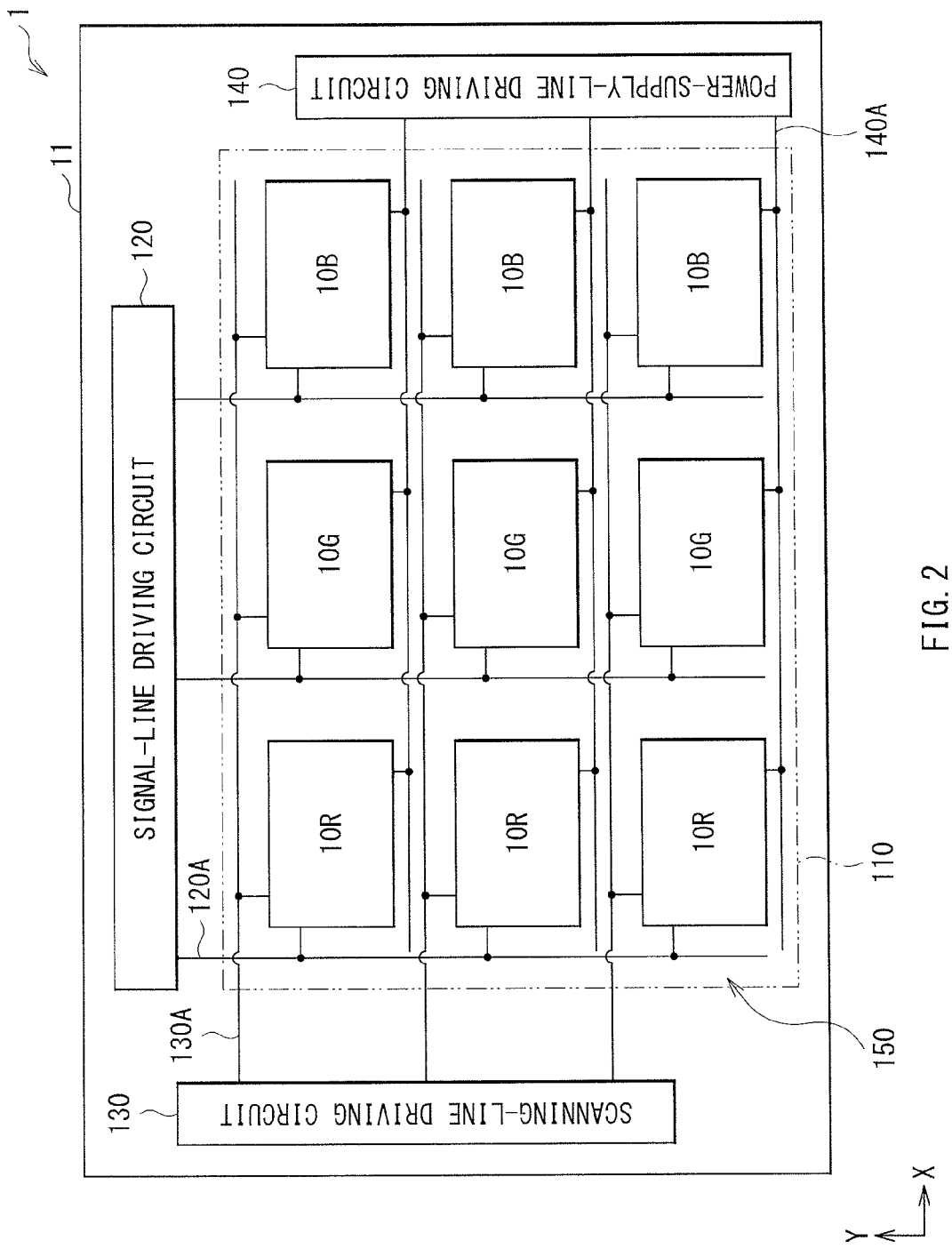
FIG. 2 is a diagram illustrating an overall configuration of the display unit illustrated in FIG. 1.

FIG. 2 illustrates an overall configuration of the display unit 1. The display unit 1 has a display region 110. In a central part of the display region 110, the organic light-emission devices 10R, 10G, and 10B are disposed two-dimensionally in a matrix. Provided around the display region 110 may be, for example, a signal-line driving circuit 120, a scanning-line driving circuit 130, and a power-supply-line driving circuit 140 that are drivers for image display.

In the display region 110, a pixel driving circuit 150 is formed together with the plurality of organic light-emission devices 10R, 10G, and 10B. The pixel driving circuit 150 is provided to drive the organic light-emission devices 10R, 10G, and 10B. In the pixel driving circuit 150, a plurality of signal lines 120A (120A1, 120A2, . . . , 120Am, . . . ) are arranged in a column direction (a Y direction). Further, in the pixel driving circuit 150, a plurality of scanning lines 130A (130A1, . . . , 130An, . . . ) and a plurality of power supply lines 140A (140A1, . . . , 140An, . . . ) are arranged in a row direction (an X direction). At an intersection of the signal line 120A and the scanning line 130A, the organic light-emission device 10R, 10G, or 10B is provided. Both ends of the signal line 120A are connected to the signal-line driving circuit 120, both ends of the scanning line 130A are connected to the scanning-line driving circuit 130, and both ends of the power supply line 140A are connected to the power-supply-line driving circuit 140.

The signal-line driving circuit 120 supplies each of the organic light-emission devices 10R, 10G, and 10B selected through the signal line 120A, with a signal voltage of an image signal in accordance with luminance information supplied from a signal supply source (not illustrated). The scanning-line driving circuit 130 includes components such as a shift register that sequentially shifts (transfers) a start pulse in synchronization with an inputted clock pulse. When writing the image signal to each of the organic light-emission devices 10R, 10G, and 10B, the scanning-line driving circuit 130 scans the organic light-emission devices 10R, 10G, and 10B row by row, and sequentially supplies a scanning signal to each of the scanning lines 130A. The signal line 120A is supplied with the signal voltage from the signal-line driving circuit 120, and the scanning line 130A is supplied with the scanning signal from the scanning-line driving circuit 130.

The power-supply-line driving circuit 140 includes components such as a shift register that sequentially shifts (transfers) a start pulse in synchronization with an inputted clock pulse. The power-supply-line driving circuit 140 appropriately supplies either of a first electric potential and a second electric potential that are different form each other, to the both ends of each of the power supply lines 140A, in synchronization with the row-by-row scanning by the scanning-line driving circuit 130. As a result, a conducting state or a non-conducting state of a transistor Tr1 to be described later is selected.

Figure 3:
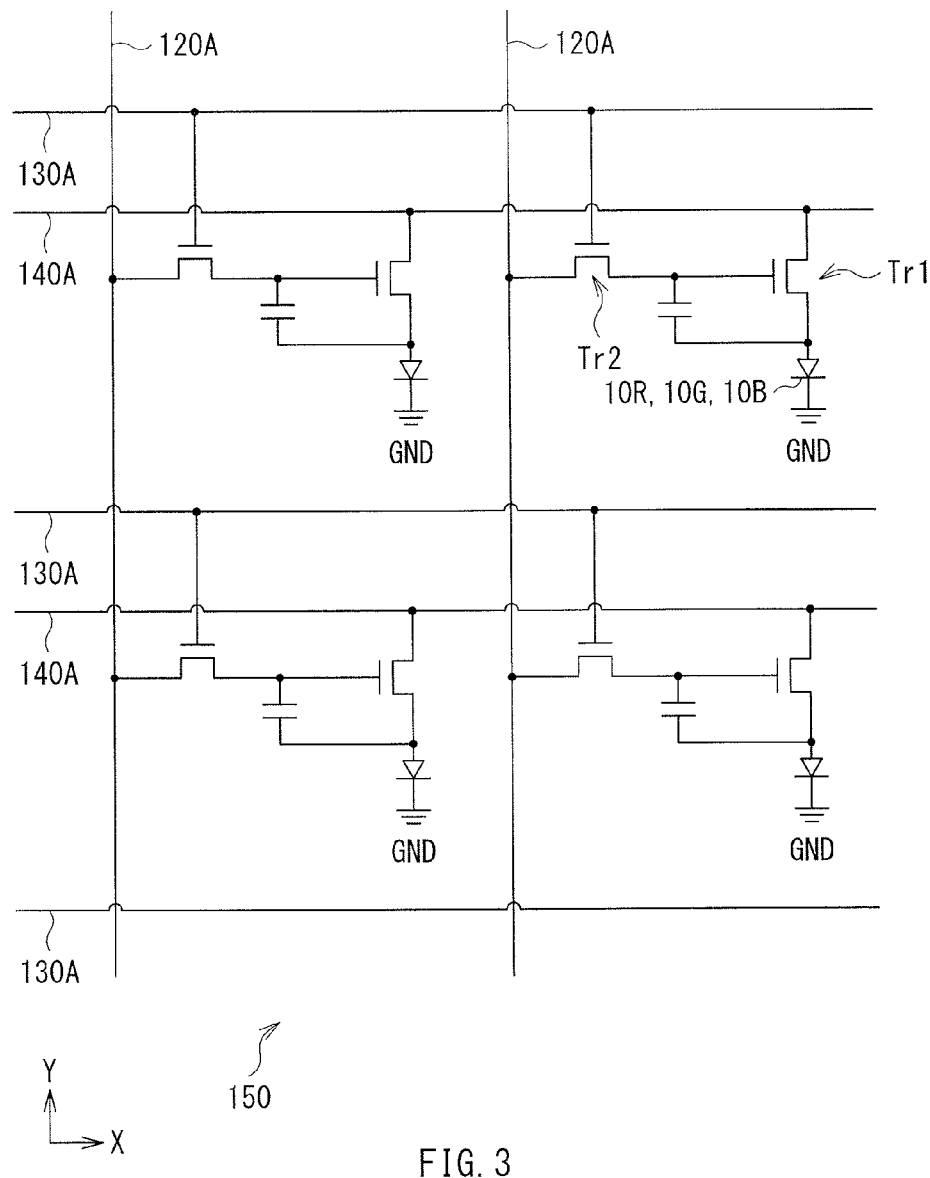
FIG. 3 is a diagram illustrating an example of a pixel driving circuit illustrated in FIG. 2.

FIG. 3 illustrates a configuration example of the pixel driving circuit 150. The pixel driving circuit 150 is an active drive circuit that includes the transistor Tr1, a transistor Tr2, a capacitor (a retention capacitor) Cs, and the organic light-emission devices 10R, 10G, and 10B. Each of the organic light-emission devices 10R, 10G, and 10B is connected to the transistor Tr1 in series, between the power supply line 140A and a common power supply line (GND). Each of the transistor Tr1 and the transistor Tr2 may have an inverted staggered structure (a so-called bottom-gate type), or may have a staggered structure (a top-gate type).

Of the transistor Tr2, for example, a drain electrode may be connected to the signal line 120A, and may be supplied with the image signal from the signal-line driving circuit 120. Further, a gate electrode of the transistor Tr2 may be connected to the scanning line 130A, and may be supplied with the scanning signal from the scanning-line driving circuit 130. Furthermore, a source electrode of the transistor Tr2 may be connected to a gate electrode of the transistor Tr1.

Of the transistor Tr1, for example, a drain electrode may be connected to the power supply line 140A, and may be set at either the first electric potential or the second electric potential by the power-supply-line driving circuit 140. A source electrode of the transistor Tr1 may be connected to the organic light-emission device 10R, 10G, or 10B.

The retention capacitor Cs is formed between the gate electrode (the source electrode of the transistor Tr2) of the transistor Tr1 and the source electrode of the transistor Tr1.

[Main-Part Configuration of Display Unit]

Next, a detailed configuration of the device panel 10 and the sealing panel 20 will be described with reference to FIG. 1 again.

The device substrate 11 is a support member where the organic light-emission devices 10R, 10G, and 10B are formed in an array on a main-surface side thereof. For the device substrate 11, for example, any of a glass substrate, a quartz substrate, and a silicon substrate may be used. Examples of the glass substrate may include high-strain-point glass, soda glass ($Na_2O \cdot CaO \cdot SiO_2$), borosilicate glass ($Na_2O \cdot B_2O_3 \cdot SiO_2$), forsterite ($2MgO \cdot SiO_2$), and lead glass ($Na_2O \cdot PbO \cdot SiO_2$). The device substrate 11 may be configured by providing an insulating film on a surface of any of these glass substrate, quartz substrate, and silicon substrate. Other materials such as metallic foil and a film or sheet made of resin may also be used for the device substrate 11. Examples of the resin may include organic polymers such as polymethyl methacrylate (PMMA), polyvinyl alcohol (PVA), polyvinyl phenol (PVP), polyether sulfone (PES), polyimide, polycarbonate, polyethylene terephthalate (PET), and polyethylene naphthalate (PEN). A flexible material may also be used for the device substrate 11. In the top emission type, light is extracted from the sealing substrate 21 side and therefore, the device substrate 11 may be formed of either a transparent material or a non-transparent material. For the sealing substrate 21, the same material as the material of the device substrate 11 may be used, or a different material may be used.

The TFT 12 may be, for example, a transistor corresponding to either the above-described transistor Tr1 or Tr2, and may serve as an active device of the organic light-emission devices 10R, 10G, or 10B. For example, a source-drain electrode of the TFT 12 may be electrically connected to a wiring 12B through an interlayer insulating film 12A made of a material such as silicon oxide. For example, when the TFT 12 is the transistor Tr2, the wiring 12B may be connected to the signal line 120A. Alternatively, for example, when the TFT 12 is the transistor Tr1, the wiring 12B may be connected to the organic light-emission device 10R, 10G, or 10B (a first electrode 14 to be described later) through a connection hole 13A of the flattening layer 13. For the interlayer insulating film 12A, for example, an organic material such as polyimide, or an inorganic material such as silicon oxide ($SiO_2$) and silicon nitride (SiN) may be used. For the interlayer insulating film 12A, for example, a $SiO_2$-based material may also be used. Examples of the $SiO_2$-based material may include borophospho silicate glass (BPSG), PSG, BSG, AsSG, SiON, spin on glass (SOG), low-melting glass, and glass paste. The wiring 12B may be configured of, for example, aluminum (Al) or an aluminum-copper (Cu) alloy.

The flattening layer 13 is provided to flatten a surface of the device substrate 11 where the TFT 12 is formed. In the flattening layer 13, the connection hole 13A that is minute and provided to connect the wiring 12B to a lower electrode 12 is formed. Therefore, the flattening layer 13 may be preferably configured of a material with favorable pattern accuracy. When a material having a low water absorption rate is used for the flattening layer 13, it is possible to prevent the organic light-emission devices 10R, 10G, and 10B from deteriorating due to moisture. For example, an organic material such as polyimide may be used for the flattening layer 13. It is also possible to suppress deterioration of the TFT 12, by adding a function of blocking blue light or UV light, to the flattening layer 13.

The organic light-emission devices 10R, 10G, and 10B each include the first electrode 14, an organic layer 16, a high-resistive layer 17, and a second electrode 18 in this order from the device substrate 11 (the flattening layer 13) side. The organic layer 16 includes a light emitting layer. An insulating film 15 is disposed between the organic light-emission devices 10R, 10G, and 10B next to each other. The organic light-emission devices 10R, 10G, and 10B may be arranged in any form. For example, the organic light-emission devices 10R, 10G, and 10B may be arranged in a stripe arrangement, a diagonal arrangement, a delta arrangement, and a rectangle arrangement, etc.

The first electrode 14 is provided for each of the organic light-emission devices 10R, 10G, and 10B. The plurality of first electrodes 14 are disposed away from each other on the flattening layer 13. The first electrode 14 has a function of serving as an anode and a function of serving as a reflective layer, and may be desirably configured of a material having high reflectance and high hole injection ability. The first electrode 14 as described above may have, for example, a thickness in a lamination direction hereinafter simply referred to as "thickness") of 0.1 μm or more and 1 μm or less. Examples of the material of the first electrode 14 may include a simple substance of metallic elements such as chromium (Cr), gold (Au), platinum (Pt), nickel (Ni), copper (Cu), molybdenum (Mo), tungsten (W), titanium (Ti), tantalum (Ta), aluminum (Al), iron (Fe), and silver (Ag), or an alloy thereof. The first electrode 14 may be configured by laminating such metal films. For the first electrode 14, an Ag—Pd—Cu alloy or an Al-neodymium (Nd) alloy may also be used. The Ag—Pd—Cu alloy is an alloy in which 0.3 wt % to 1 wt % of palladium (Pd) and 0.3 wt % to 1 wt % of copper are contained in silver. A material having a high work function may be preferably used for the first electrode 14. However, metal having a low work function such as aluminum and aluminum alloys may be used for the first electrode 14, by appropriately selecting the organic layer 16 (in particular, a hole injection layer to be described later).

Figure 4:
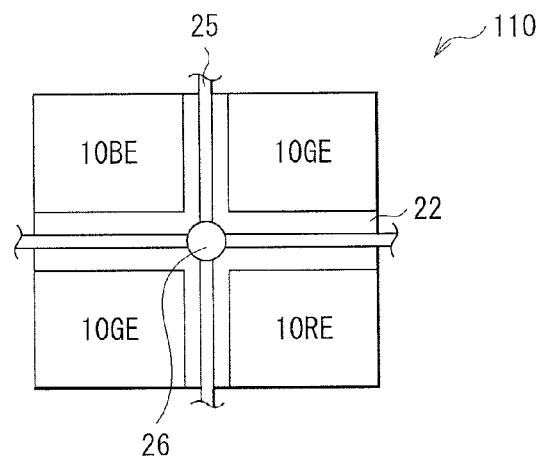
FIG. 4 is a plan view illustrating a configuration of a display region of a sealing panel illustrated in FIG. 1.

A part from a top surface (a surface facing the second electrode 18) to side surfaces of the first electrode 14 is covered with the insulating film 15. The insulating film 15 is provided with an opening used to define light emission regions (light emission regions 10RE, 10GE, and 10BE that are illustrated in FIG. 4 and will be described later) of the organic light-emission devices 10R, 10G, and 10B. The insulating film 15 serves to control the light emission region precisely to a desirable shape, and to secure insulation between the first electrode 14 and the second electrode 18. For example, an organic material such as polyimide, or an inorganic material such as silicon oxide ($SiO_2$), silicon nitride ($SiN_x$), and silicon oxynitride (SiON) may be used for the insulating film 15. The insulating film 15 may have a thickness of, for example, 50 nm to 2,500 nm.

The organic layer 16 may be provided, for example, to be common to all of the organic light-emission devices 10R, 10G, and 10B. The organic layer 16 may include a hole injection layer, a hole transport layer, the light emitting layer, an electron transport layer, and an electron injection layer (none of these layers are illustrated) in this order from the first electrode 14 side. The organic layer 16 may be configured of the hole transport layer, the light emitting layer, and the electron transport layer. In this case, the light emitting layer may also serve as the electron transport layer. A plurality of such laminated structures (so-called tandem units) each including a series of layers may be laminated with a connection layer interposed therebetween, to configure the organic layer 16. For example, the tandem units for the respective colors of red, green, and blue may be provided and laminated to configure the organic layer 16.

The hole injection layer is a buffer layer provided to increase hole injection efficiency and to prevent leakage. For example, the hole injection layer may have a thickness of 1 nm or more and 300 nm or less, and may be configured of a hexaazatriphenylene derivative expressed by the following chemical formula 1 or chemical formula 2.

[Chemical Formula 1]

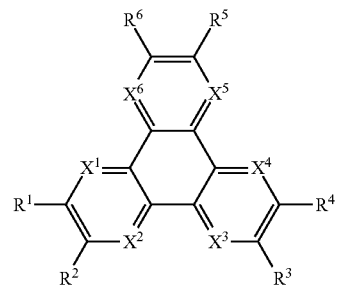

(In the chemical formula 1, R1 to R6 are each independently a substituent group selected from hydrogen, halogen, a hydroxyl group, an amino group, an arylamino group, a substituted or unsubstituted carbonyl group with carbon number of 20 or less, a substituted or unsubstituted carbonyl ester group with carbon number of 20 or less, a substituted or unsubstituted alkyl group with carbon number of 20 or less, a substituted or unsubstituted alkenyl group with carbon number of 20 or less, a substituted or unsubstituted alkoxyl group with carbon number of 20 or less, a substituted or unsubstituted aryl group with carbon number of 30 or less, a substituted or unsubstituted heterocyclic group with carbon number of 30 or less, a nitrile group, a cyano group, a nitro group, and a silyl group. $R^m$s (m=1 to 6) next to each other may be coupled to each other through a cyclic structure. Further, X1 to X6 are each independently a carbon or nitrogen atom.)

[Chemical Formula 2]

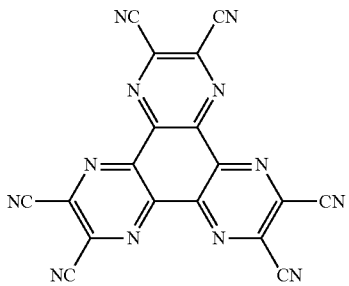

The hole transport layer is provided to increase hole transport efficiency for the light emitting layer. For example, the hole transport layer may have a thickness of about 40 nm, and may be configured of 4,4',4"-tris(3-methylphenylphenylamino)triphenylamine (m-MTDATA), or α-naphthylphenyldiamine (α NPD).

For example, the light emitting layer may be provided for white light emission, and have, for example, a laminated body including a red light emitting layer, a green light emitting layer, and a blue light emitting layer (none of these layers are illustrated) between the first electrode 14 and the second electrode 18. The red light emitting layer, the green light emitting layer, and the blue light emitting layer emit light of red, green, and blue, respectively, by electron-hole recombination caused by application of an electric field. In this recombination, part of holes injected from the first electrode 14 through the hole injection layer and the hole transport layer is recombined with part of electrons injected from the second electrode 18 through the electron injection layer and the electron transport layer.

The red light emitting layer may include, for example, one or more of a red luminescent material, a hole-transporting material, an electron-transporting material, and a both-carrier transporting material. The red luminescent material may be either a fluorescent material or a phosphorescent material. The red light emitting layer may have, for example, a thickness of about 5 nm, and may be configured of 4,4-bis(2,2-diphenylvinyl)biphenyl (DPVBi) mixed with 30 wt % of 2,6-bis[(4'-methoxydiphenylamino)styryl]-1,5-dicyanonaphthalene (BSN).

The green light emitting layer may include, for example, one or more of a green luminescent material, a hole-transporting material, an electron-transporting material, and a both-carrier transporting material. The green light emitting layer may be either a fluorescent material or a phosphorescent material. The green light emitting layer may have, for example, a thickness of about 10 nm, and may be configured of DPVBi mixed with 5 wt % of coumarin 6.

The blue light emitting layer may include, for example, one or more of a blue luminescent material, a hole-transporting material, an electron-transporting material, and a both-carrier transporting material. The blue light emitting layer may be either a fluorescent material or a phosphorescent material. The blue light emitting layer may have, for example, a thickness of about 30 nm, and may be configured of DPVBi mixed with 2.5 wt % of 4,4'-bis[2-{4-(N,N-diphenylamino)phenyl}vinyl]biphenyl (DPAVBi).

The electron transport layer is provided to increase electron transport efficiency for the light emitting layer, and may be configured of, for example, 8-hydroxyquinolinealuminum (Alq3) having a thickness of about 20 nm. The electron injection layer is provided to increase electron injection efficiency for the light emitting layer, and may be configured of, for example, LiF, $Li_2O$, or the like having a thickness of about 0.3 nm.

The high-resistive layer 17 is used to prevent occurrence of a short circuit between the first electrode 14 and the second electrode 18, and is provided to be common to all of the organic light-emission devices 10R, 10G, and 10B. The high-resistive layer 17 has electric resistance higher than electric resistance of each of the first electrode 14 and the second electrode 18. The high-resistive layer 17 has a charge transport function or a charge injection function. When the organic light-emission devices 10R, 10G, and 10B are formed while a particle (foreign matter) or projection is present on the first electrode 14, a short circuit may occur due to contact between the first electrode 14 and the second electrode 18. The high-resistive layer 17 makes it possible to prevent such contact between the first electrode 14 and the second electrode 18.

The high-resistive layer 17 may be preferably configured of, for example, a material having electric resistivity of $1\times10^6$ Ω·m or more and $1\times10^8$ Ω·m or less. This is because, within this range, it is possible to prevent occurrence of a short circuit sufficiently, while keeping a drive voltage low. The high-resistive layer 17 may be configured of, for example, niobium oxide ($Nb_2O_5$), titanium oxide ($TiO_2$), molybdenum oxide ($MoO_2$, $MoO_3$), tantalum oxide ($Ta_2O_5$), hafnium oxide (HfO), magnesium oxide (MgO), IGZO ($InGaZnO_x$), a mixture of niobium oxide and titanium oxide, a mixture of titanium oxide and zinc oxide (ZnO), a mixture of a silicon oxide ($SiO_2$) and tin oxide ($SnO_2$), and a mixture in which zinc oxide is mixed with one or more of magnesium oxide, silicon oxide, and aluminum oxide ($Al_2O_3$). The high-resistive layer 17 may be configured by appropriately combining some of these materials. The high-resistive layer 17 having a value of a refractive index closer to those of the organic layer 16 and the second electrode 18 may be preferably used. For example, the value of the refractive index may preferably be 1.7 or more, and more preferably, may be 1.9 or more. This improves external quantum efficiency of the light emitting layer of the organic layer 16. The high-resistive layer 17 may have a thickness of, for example, about 100 nm to about 1,000 nm.

The second electrode 18 is paired with the first electrode 14, with the organic layer 16 interposed therebetween. For example, the second electrode 18 may be provided on the electron injection layer, to be common to all of the organic light-emission devices 10R, 10G, and 10B. The second electrode 18 may be made of, for example, a transparent material having optical transparency. Examples of this transparent material may include an alloy of aluminum (Al), magnesium (Mg), silver (Ag), calcium (Ca), and sodium (Na). In particular, an alloy of magnesium and silver (an Mg—Ag alloy) may be preferably used, because the Mg—Ag alloy has both conductivity and low absorption in form of a thin film. The ratio between magnesium and silver in the Mg—Ag alloy is not limited in particular, but may be preferably in a range in which an Mg to Ag film-thickness ratio is from 20:1 to 1:1. Further, an alloy of aluminum (Al) and lithium (Li) (an Al—Li alloy) may also be used for the material of the second electrode 18. Furthermore, a material such as indium tin oxide (ITO), zinc oxide (ZnO), aluminum-doped zinc oxide (AZO), gallium-doped zinc oxide (GZO), indium zinc oxide (IZO), indium titanium oxide (ITiO), and indium tungsten oxide (IWO) may also be used. As will be described later in detail, the auxiliary wiring 25 is provided in the display unit 1 and therefore, it is possible to reduce the thickness of the second electrode 18. The second electrode 18 may have a thickness of, for example, about 10 nm to about 500 nm. The second electrode 18 and the high-resistive layer 17 also have a function of preventing entrance of moisture into the organic layer 16.

The protective layer 19 is used to prevent entrance of moisture into the organic layer 16, and is provided over the entire surface of the device substrate 11 to cover the second electrode 18. The protective layer 19 may be configured of, for example, a light-transmissive conductive material such as IZO. A material that allows, for example, 80% or more of light generated in the organic layer 16 to pass therethrough may be preferably used for the protective layer 19.

Between the device panel 10 and the sealing panel 20, the filling resin 30A and a sealing resin 30B are provided (as illustrated in FIG. 21A to be described later). The filling resin 30A is provided to prevent entrance of moisture into the organic layer 16 and to increase mechanical strength of the display unit 1. The filling resin 30A is provided to cover at least the display region 110. The filling resin 30A may preferably have optical transmittance of about 80%. In addition, the filling resin 30A may preferably have a thickness of 3 µm to 20 µm, and more preferably, of 5 µm to 15 µm. If the thickness of the filling resin 30A is larger than 20 µm, a distance between the color filter 23 and each of the organic light-emission devices 10R, 10G, and 10B may become longer, and luminance in an oblique direction with respect to the device substrate 11 may become lower than luminance in a front direction. In addition, a viewing angle may become narrow, because of a reduction in chromaticity due to occurrence of color mixture. On the other hand, if the thickness of the filling resin 30A is smaller than 3 µm, when the sealing panel 20 and the device panel 10 are adhered to each other while foreign matter is sandwiched therebetween, this foreign matter easily touches the organic light-emission devices 10R, 10G, and 10B. The organic light-emission devices 10R, 10G, and 10B may be pressurized by the foreign matter, which may cause a dark spot such as pixel omission.

The sealing resin 30B is used to bond the device panel 10 and the sealing panel 20 together, and provided to surround the filling resin 30A. The sealing resin 30B also serves to prevent entrance of moisture from outside into the display region 110. It is possible to define a distance between the device panel 10 and the sealing panel 20, by using the sealing resin 30B. For example, the sealing resin 30B may be configured by mixing particles having a desirable particle size into a resin material. This allows the distance between the device panel 10 and the sealing panel 20 to be adjusted to substantially the same size as the particle size. This particle size may be, for example, 3 µm to 20 µm, and preferably, 5 µm to 15 µm.

The light-shielding layer 22 of the sealing panel 20 is a so-called black matrix (BM), and may be, for example, patterned into a matrix to match with the arrangement of the organic light-emission devices 10R, 10G, and 10B (FIG. 4). The light generated in each of the organic light-emission devices 10R, 10G, and 10B is extracted through an opening of the light-shielding layer 22. The light-shielding layer 22 may be preferably configured of carbon black. A material having both light blocking characteristics and conductivity such as chromium and graphite may also be used for the light-shielding layer 22. Alternatively, the light-shielding layer 22 may be configured of a thin-film filter utilizing thin-film interference. For example, this thin-film filter may be configured by laminating one or more thin films made of materials such as metal, metal nitride, and metal oxide, to reduce the light by causing thin-film interference. Examples of such a thin-film filter may include a film in which 65 nm of silicon nitride (SiN), 20 nm of amorphous silicon (a-Si), and 50 nm or more of molybdenum (Mo) are laminated in this order from the sealing substrate 21 side. The examples may further include a film in which 45 nm of molybdenum oxide ($MoO_x$), 10 nm of molybdenum, 40 nm of molybdenum oxide, and 50 nm or more of molybdenum (Mo) are laminated in this order from the sealing substrate 21 side.

The color filter 23 may include, for example, a red filter 23R, a green filter 23G, and a blue filter 23B that are in a color arrangement corresponding to the patterns of the light-shielding layer 22 and the organic light-emission devices 10R, 10G, and 10B. The color filter 23 may be provided at a position overlapping the light-shielding layer 22. The red filter 23R, the green filter 23G, and the blue filter 23B may each be configured of, for example, resin mixed with a pigment or a dye. By selecting the kind of this pigment or dye appropriately, the red filter 23R, the green filter 23G, and the blue filter 23B are each adjusted so that optical transmittance in a wavelength region of each of red, green, and blue becomes high. Optical transmittance of the color filter 23 is low in regions other than the wavelength regions intended for red, green, and blue. The color filter 23 may have a thickness of, for example, 1 µm to 4 µm. The color filter 23 may be provided on a surface on either side (a surface facing the device substrate 11 or a surface opposite thereto) of the sealing substrate 21. However, the color filter 23 may be preferably provided on the side where the organic light-emission devices 10R, 10G, and 10B are provided. One reason for this is that the color filter 23 is allowed to be protected by the protective layer 19 (or a bonding layer), without being exposed on the surface. Another reason is that the distance between the organic layer 16 and the color filter 23 becomes short, which makes it possible to avoid occurrence of color mixture due to entrance of light emitted from the organic layer 16 into the adjacent color filter of other color.

A surface (a surface facing the device substrate 11) of the color filter 23 is covered with the overcoat layer 24. The overcoat layer 24 is a coating agent used to increase flatness of the surface of the color filter 23 and to protect this surface. The overcoat layer 24 may be configured of, for example, an organic material such as resin or an inorganic material such as SiO, SiN, and ITO.

The auxiliary wiring 25 is provided to connect a first peripheral electrode 25A to be described later, to the second electrode 18 of the organic light-emission devices 10R, 10G, and 10B, electrically. The auxiliary wiring 25 may be preferably configured of a material having high conductivity and resistant to oxidizing in the air. Specific examples of the material of the auxiliary wiring 25 may include aluminum (Al), silver (Ag), gold (Au), copper (Cu), chromium (Cr), zinc (Zn), iron (Fe), tungsten (W), and cobalt (Co). Aluminum is relatively prone to be oxidized and therefore, the auxiliary wiring 25 may be preferably configured by covering a surface of aluminum with molybdenum (Mo) or titanium (Ti). It is possible to suppress occurrence of a so-called IR drop, by providing the above-described auxiliary wiring 25. This will be described below.

In a top-emission-type display unit, a light-transmissive conductive film is used for the second electrode. However, the light-transmissive conductive film has high resistivity and therefore, a rate of increase in wiring resistance in accordance with a distance from a feeding point to each pixel (each of the organic light-emission devices) is large. In addition, the second electrode may preferably have a small thickness, which further increases the resistance of the second electrode. Therefore, if the distance between the feeding point and the pixel becomes long, an effective voltage applied to the organic light-emission device considerably drops and luminance also greatly decreases. It is possible to suppress the occurrence of such an IR drop, by providing the auxiliary wiring 25 serving as a current bypass between the second electrode 18 and the feeding point of the second electrode 18. As illustrated in FIG. 4, the auxiliary wiring 25 in the display region 110 may be provided, for example, in a matrix to overlap the light-shielding layer 22. The conductive light-shielding layer 22 may be used to serve also as the auxiliary wiring 25. In place of the auxiliary wiring 25 in the matrix, a transparent conductive film may be provided on the entire surface of the sealing substrate 21, and may be used as the auxiliary wiring 25. The material, thickness, width, etc. of the auxiliary wiring 25 may be appropriately adjusted according to factors such as a panel size.

The pillar 26 becomes the feeding point for the second electrode 18, and electrically connects the second electrode 18 to the auxiliary wiring 25. The pillar 26 is disposed in a region (a non light emission region) between the organic light-emission devices 10R, 10G, and 10B next to each other. The pillar 26 may be, for example, in contact with the auxiliary wiring 25 and the second electrode 18. The pillar 26 may be provided for each of the organic light-emission devices 10R, 10G, and 10B. Alternatively, one pillar 26 may be provided for the plurality of organic light-emission devices 10R, 10G, and 10B.

It may only be necessary for the pillar 26 to be in contact with the second electrode 18, by protruding, for example, about 3 μm to about 20 μm, preferably, about 5 μm to about 15 μm, from the sealing panel 20 side. The distance between the device panel 10 and the sealing panel 20 may also be defined by the size of the pillar 26. Using the pillar 26 that is elastic and deformable, the second electrode 18 of the device panel 10 and the auxiliary wiring 25 of the sealing panel 20 may be preferably connected to each other with reliability. If there are variations in the size of the formed pillars 26, the pillars 26 of larger sizes are sequentially brought into contact with the second electrode 18 of the device panel 10, when the sealing panel 20 is adhered to the device panel 10. The elastic and deformable pillar 26 is capable of absorbing these variations in size and therefore, it is possible to bring the second electrode 18 into contact with the smallest pillar 26 reliably. Further, it is also possible to prevent damage, by absorbing pressure applied to the large pillars 26. The distance between the device panel 10 and the sealing panel 20 may also be adjusted by the thickness of the color filter 23 between the light-shielding layer 22 and the overcoat layer 24, in addition to the pillar 26. This distance may be adjusted by overlapping end parts of the red filter 23R, the green filter 23G, and the blue filter 23B next to each other.

The pillar 26 may be in any shape. The pillar 26 may be shaped to have, for example, a rectangular parallelepiped shape, a circular cylindrical shape, or a tapered shape. The pillar 26 may be configured of, for example, a resin material such as acrylic resin, epoxy resin, and polyimide resin, which is mixed with electrically-conductive fine particles. The pillar 26 may be configured by providing a surface of the shaped insulating resin with a transparent conductive film such as ITO and IZO, or by covering the shaped insulating resin with the material of the above-described auxiliary wiring 25.

The display unit 1 includes the first peripheral electrode 25A and a second peripheral electrode 12C outside the display region 110. The first peripheral electrode 25A and the second peripheral electrode 12C are provided on the sealing panel 20 side and on the device panel 10 side, respectively.

Figure 5:
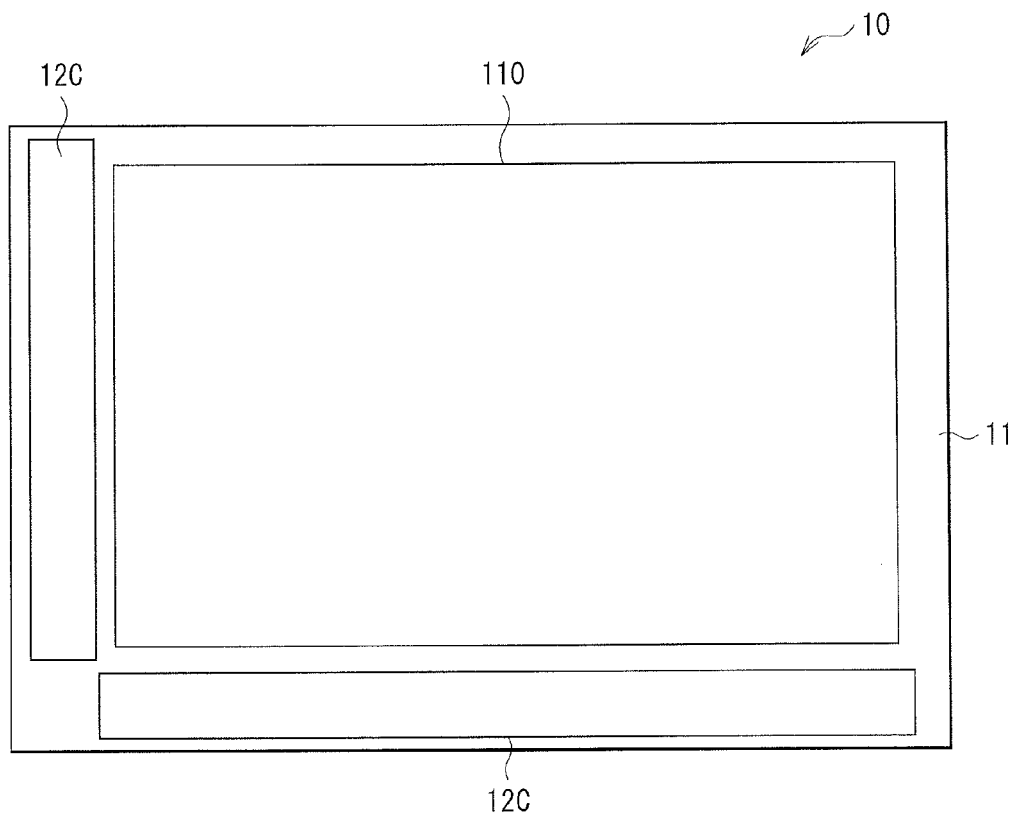
FIG. 5 is a plan view illustrating a plane configuration of an entire device panel illustrated in FIG. 1.

As illustrated in FIG. 5, the second peripheral electrode 12C may be provided, for example, at each of two sides of a peripheral edge of the device panel 10. The second peripheral electrode 12C is a bonding pad electrode provided to send a drive signal to the first electrode 14 of each of the organic light-emission devices 10R, 10G, and 10B through the TFT 12. The second peripheral electrode 12C may be electrically connected to, for example, a wiring substrate (not illustrated) where a driver IC is implemented.

Figure 6:
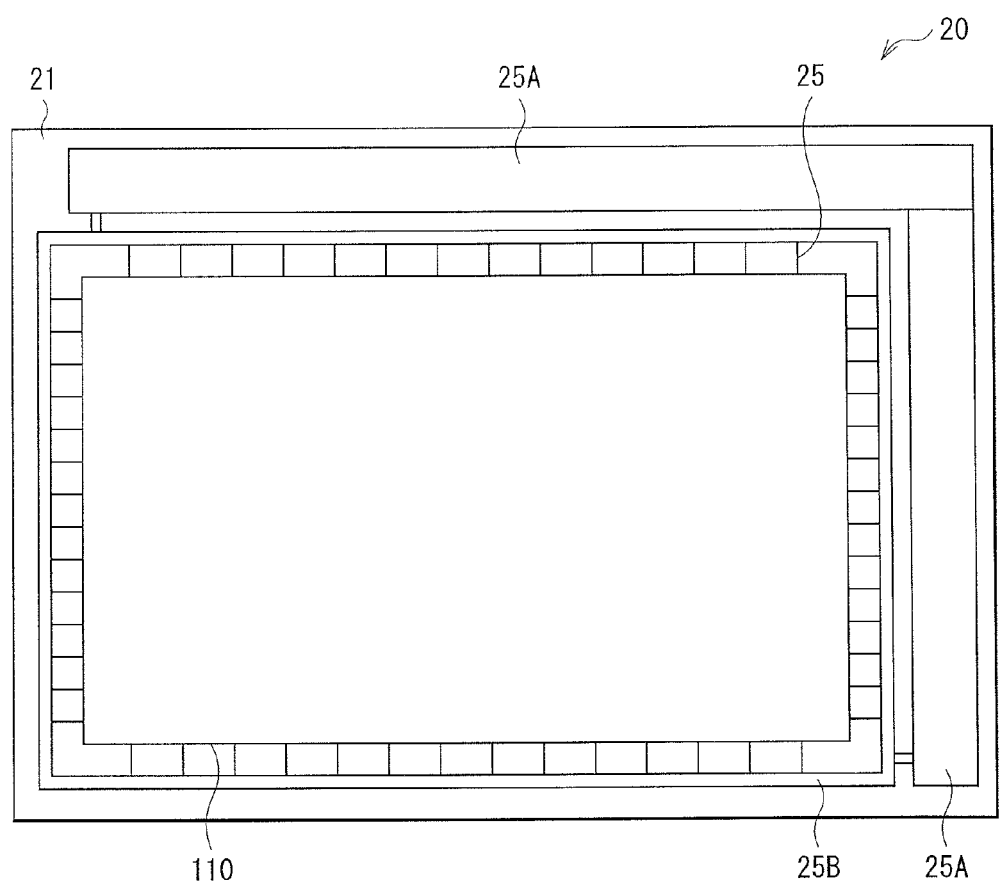
FIG. 6 is a plan view illustrating a plane configuration of the entire sealing panel illustrated in FIG. 1.

As illustrated in FIG. 6, the first peripheral electrode 25A is electrically connected to the auxiliary wiring 25 through a wiring 25B surrounding the display region 110. In other words, the first peripheral electrode 25A is electrically connected to the second electrode 18 of the organic light-emission devices 10R, 10G, and 10B. In the present embodiment, the first peripheral electrode 25A is provided on the sealing panel 20 as described above. As will be described later in detail, this makes it possible to reduce the number of masks to be used in a process of manufacturing the display unit 1, which allows low-cost manufacturing. The first peripheral electrode 25A may be, for example, a pad electrode electrically connected to the common power supply line (GND), and may be provided at each of two sides of a peripheral edge of the sealing panel 20 (FIG. 6). Between the sealing substrate 21 and the first peripheral electrode 25A, the overcoat layer 24 may be provided, or the light-shielding layer 22 may be provided in addition to the overcoat layer 24.

As illustrated in FIG. 7, of the device panel 10, a part provided with the second peripheral electrode 12C is disposed not to overlap the sealing panel 20 (the sealing substrate 21). Further, of the sealing panel 20, a part provided with the first peripheral electrode 25A is disposed not to overlap the device panel 10 (the device substrate 11).

[Method of Manufacturing Display Unit]

The display unit 1 as described above may be manufactured, for example, by forming the device panel 10 and the sealing panel 20, and then adhering these panels to each other. Processes (FIGS. 8A to 8D) of forming the device panel 10, processes (FIGS. 20A and 20B) of forming the sealing panel 20, and processes (FIGS. 21A to 21C) of adhering these panels to each other will be described below in this order.

[Method of Manufacturing Device Panel 10]

First, the TFT 12, the interlayer insulating film 12A, the wiring 12B, the second peripheral electrode 12C, and the flattening layer 13 are formed on the device substrate 11. The flattening layer 13 may be formed by, for example, any of chemical vapor deposition (CVD), coating, sputtering, various kinds of printing methods, and the like. In the flattening layer 13, the connection hole 13A is provided beforehand.

Figure 8A:
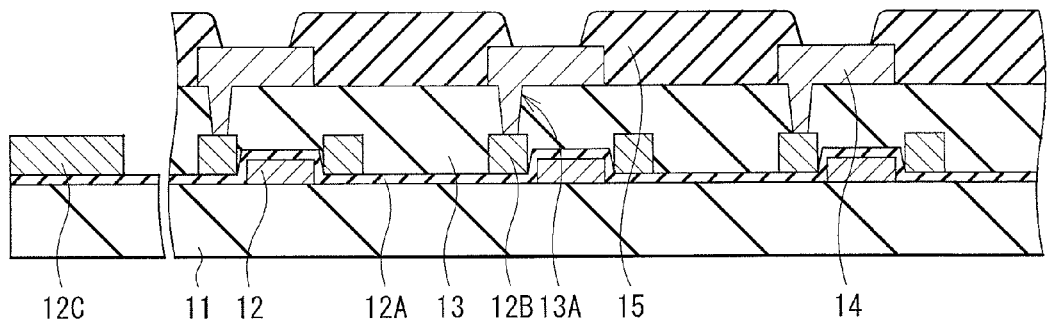
FIG. 8A is a cross-sectional diagram illustrating a process of manufacturing the device panel illustrated in FIG. 1.

Next, a conductive film may be deposited on the flattening layer 13 by, for example, sputtering, and then the deposited conductive film may be patterned using a photolithography process to form the first electrode 14. Subsequently, for example, a silicon nitride film may be deposited on the first electrode 14 and the flattening layer 13 by, for example, plasma CVD, and then an opening is provided in this silicon nitride film to form the insulating film 15 (FIG. 8A).

Figure 8B:
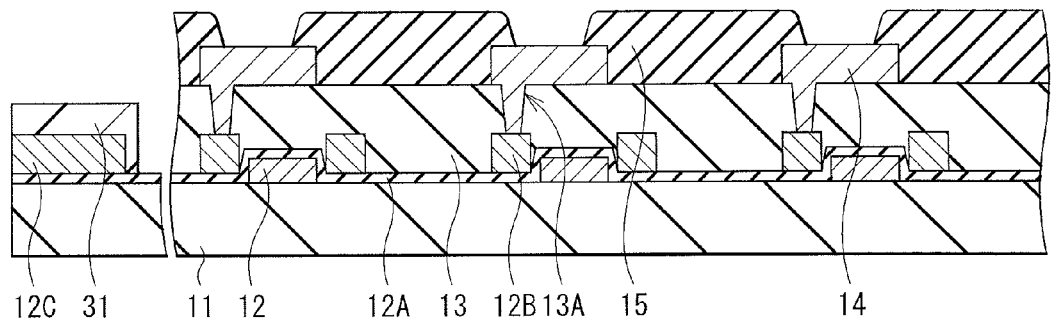
FIG. 8B is a cross-sectional diagram illustrating a process following the process in FIG. 8A.

Next, a protective film 31 is formed to cover the second peripheral electrode 12C (FIG. 8B). The protective film 31 is provided to prevent the materials of the organic layer 16 and the second electrode 18 from attaching to the second peripheral electrode 12C in subsequent processes. For example, a single-use material such as tape may be used as the protective film 31. Use of such a single-use material as the protective film 31 allows a reduction in cost. The protective film 31 may be configured of a resin material, and may be removed by an organic solvent after the organic layer 16 and the second electrode 18 are formed. For example, the protective film 31 may be removed in a physical way such as scraping off.

Figure 8C:
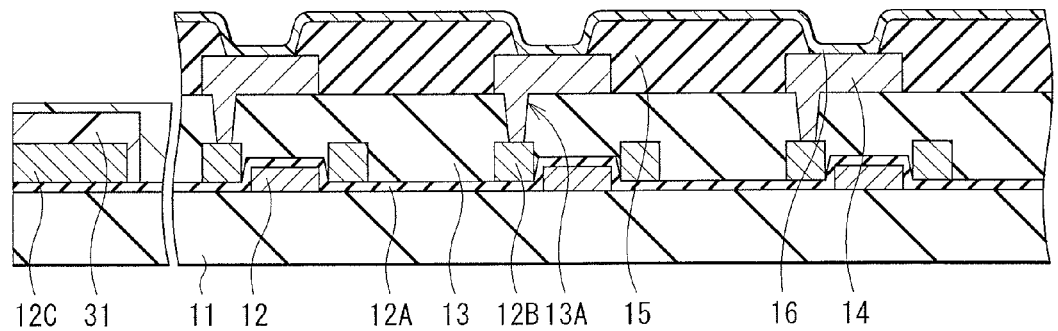
FIG. 8C is a cross-sectional diagram illustrating a process following the process in FIG. 8B.
Figure 8D:
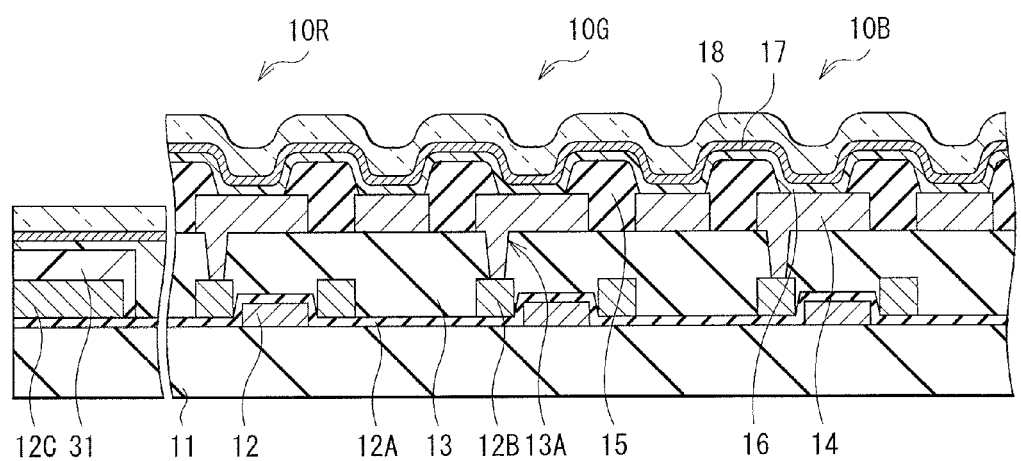
FIG. 8D is a cross-sectional diagram illustrating a process following the process in FIG. 8C.

After the protective film 31 is formed, the organic layer 16 including the light emitting layer, the high-resistive layer 17, and the second electrode 18 may be formed on the entire surface of the device substrate 11 by, for example, physical vapor deposition (PVD) such as vacuum deposition (FIGS. 8C and 8D). The organic layer 16, the high-resistive layer 17, and the second electrode 18 may be formed by a printing method such as screen printing and ink-jet printing, laser transfer, coating, or the like. The laser transfer is a method of transferring the organic layer 16 to the device substrate 11, by emitting a laser to a laminated structure including a laser absorbing layer and the organic layer 16 formed on a transfer substrate. The organic layer 16, the high-resistive layer 17, and the second electrode 18 may be formed after the second peripheral electrode 12C is covered with an area mask (not illustrated) without providing the protective film 31. However, use of the protective film 31 allows a further reduction in cost. After the second electrode 18 is provided, the protective layer 19 may be formed by, for example, vacuum deposition. Forming the protective layer 19 by the vacuum deposition may be preferable, because energy of film formation particles is small and therefore it is possible to suppress an influence on a lower layer. Similarly, the protective layer 19 may be formed by CVD whose influence on a lower layer is small. The organic layer 16 may be preferably prevented from deteriorating due to atmospheric moisture and oxygen, by forming the protective layer 19 without exposing the second electrode 18 to an atmosphere. Further, it is possible to prevent deterioration in luminance due to deterioration of the organic layer 16, by setting film formation temperature of the protective layer 19 at ambient temperature. It is possible to prevent film exfoliation of the protective layer 19, by depositing the protective layer 19 on condition that applied stress is minimized. The device panel 10 is completed through the above-described processes.

In the present embodiment, the first peripheral electrode 25A is provided at the sealing panel 20. Therefore, it is possible to reduce the number of masks to be used in the processes of forming the organic layer 16, the high-resistive layer 17, and the second electrode 18. This will be described below.

Figure 9:
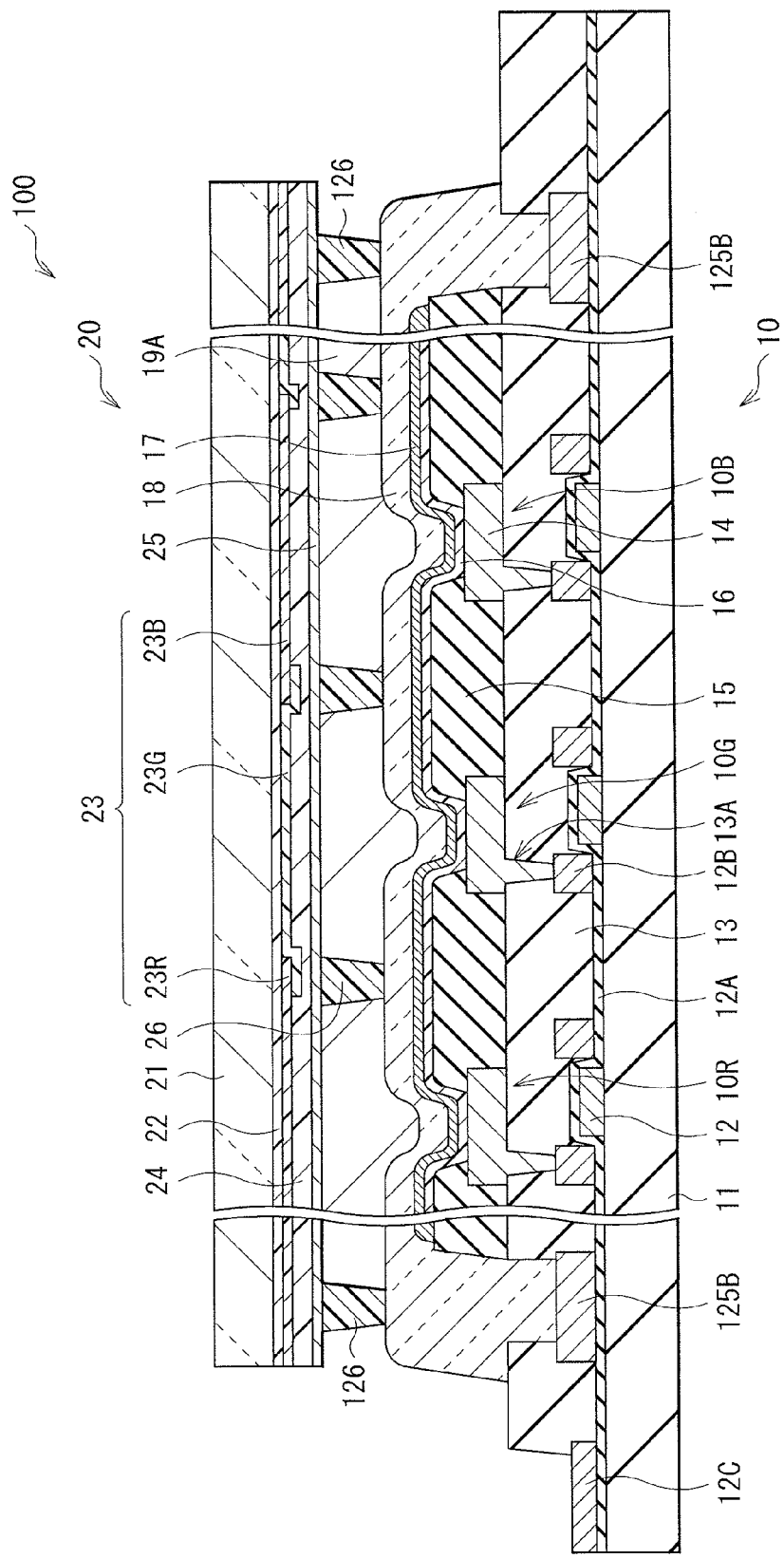
FIG. 9 is a cross-sectional diagram illustrating a configuration of a display unit according to a comparative example.
Figure 10:
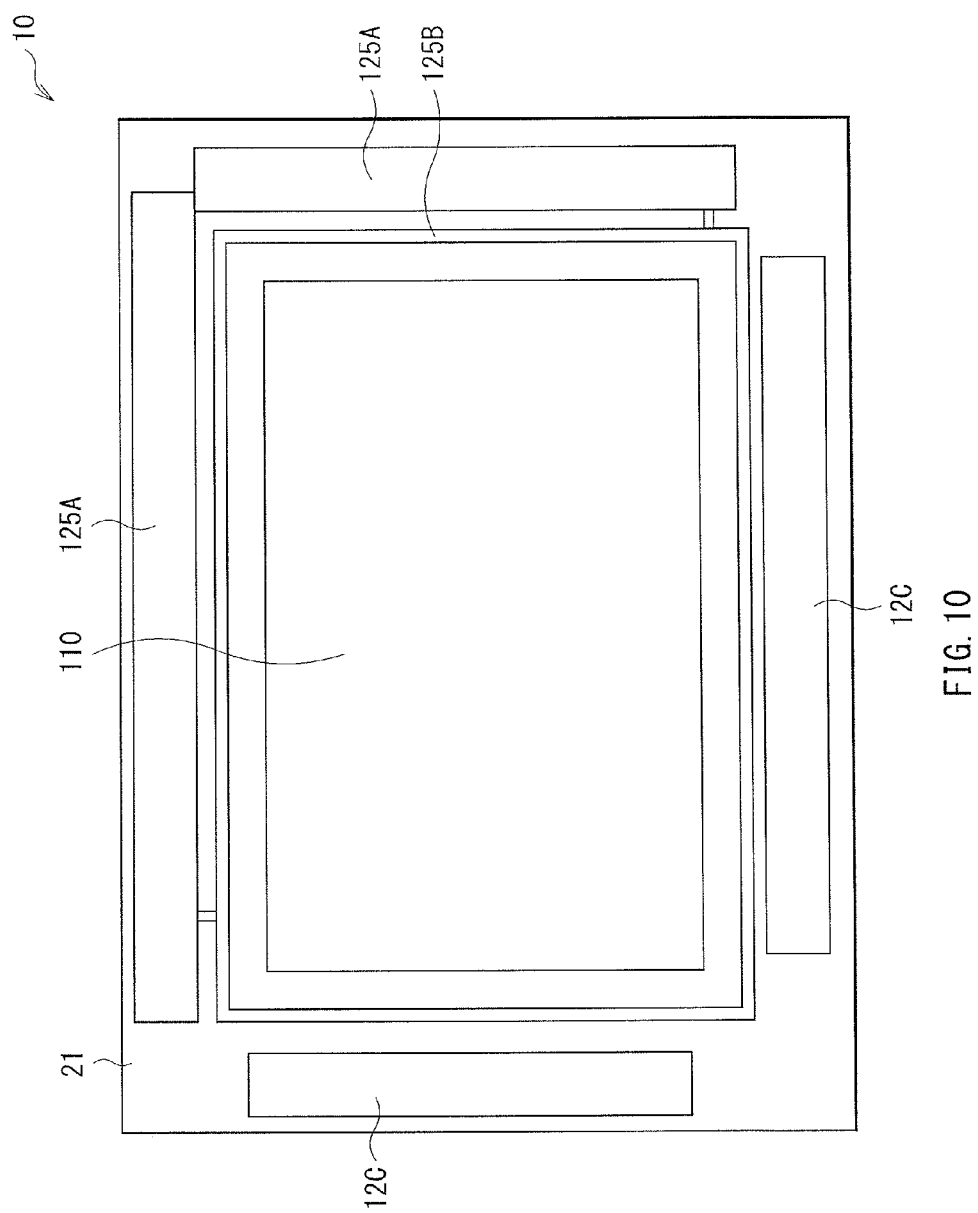
FIG. 10 is a plan view illustrating a configuration of a device panel illustrated in FIG. 9.
Figure 11:
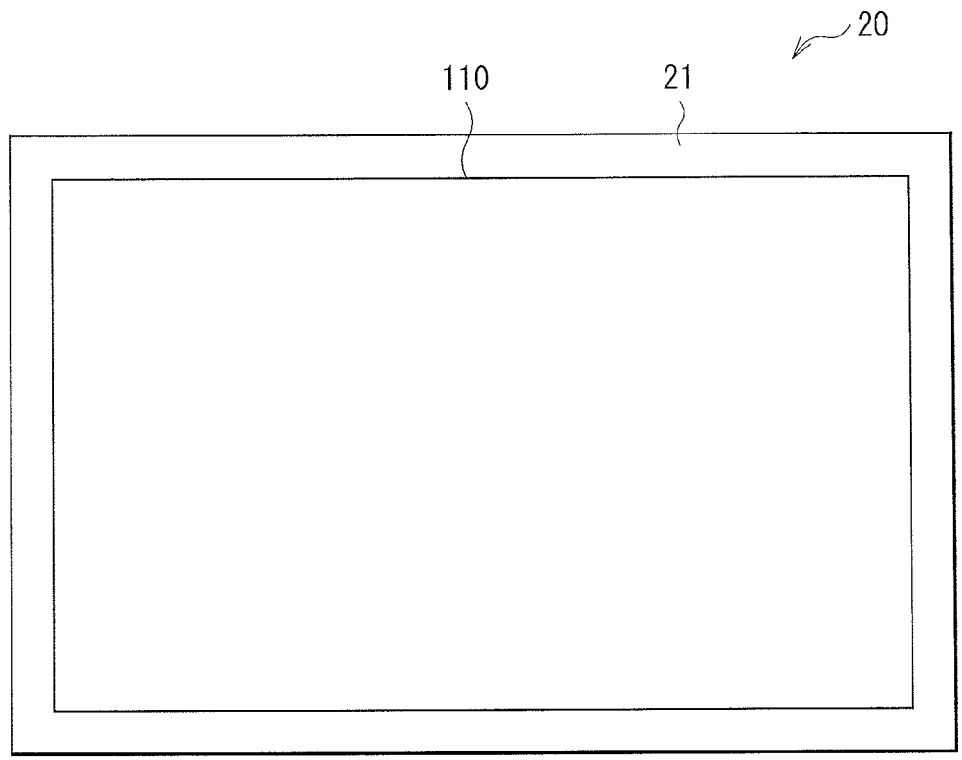
FIG. 11 is a plan view illustrating a configuration of a sealing panel illustrated in FIG. 9.
Figure 12:
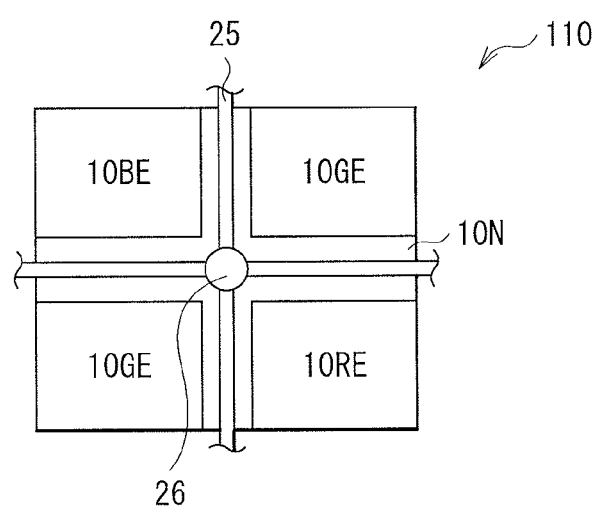
FIG. 12 is a plan view illustrating a configuration of a display region of the sealing panel illustrated in FIG. 11.
Figure 13:
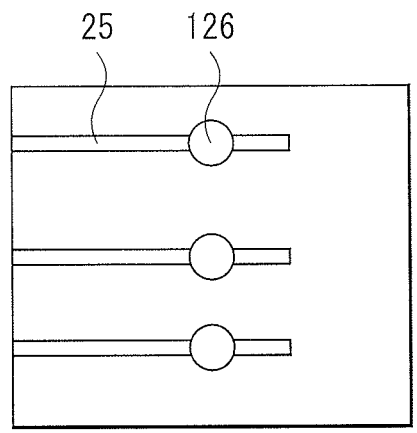
FIG. 13 is a plan view illustrating a configuration outside the display region of the sealing panel illustrated in FIG. 11.
Figure 14:
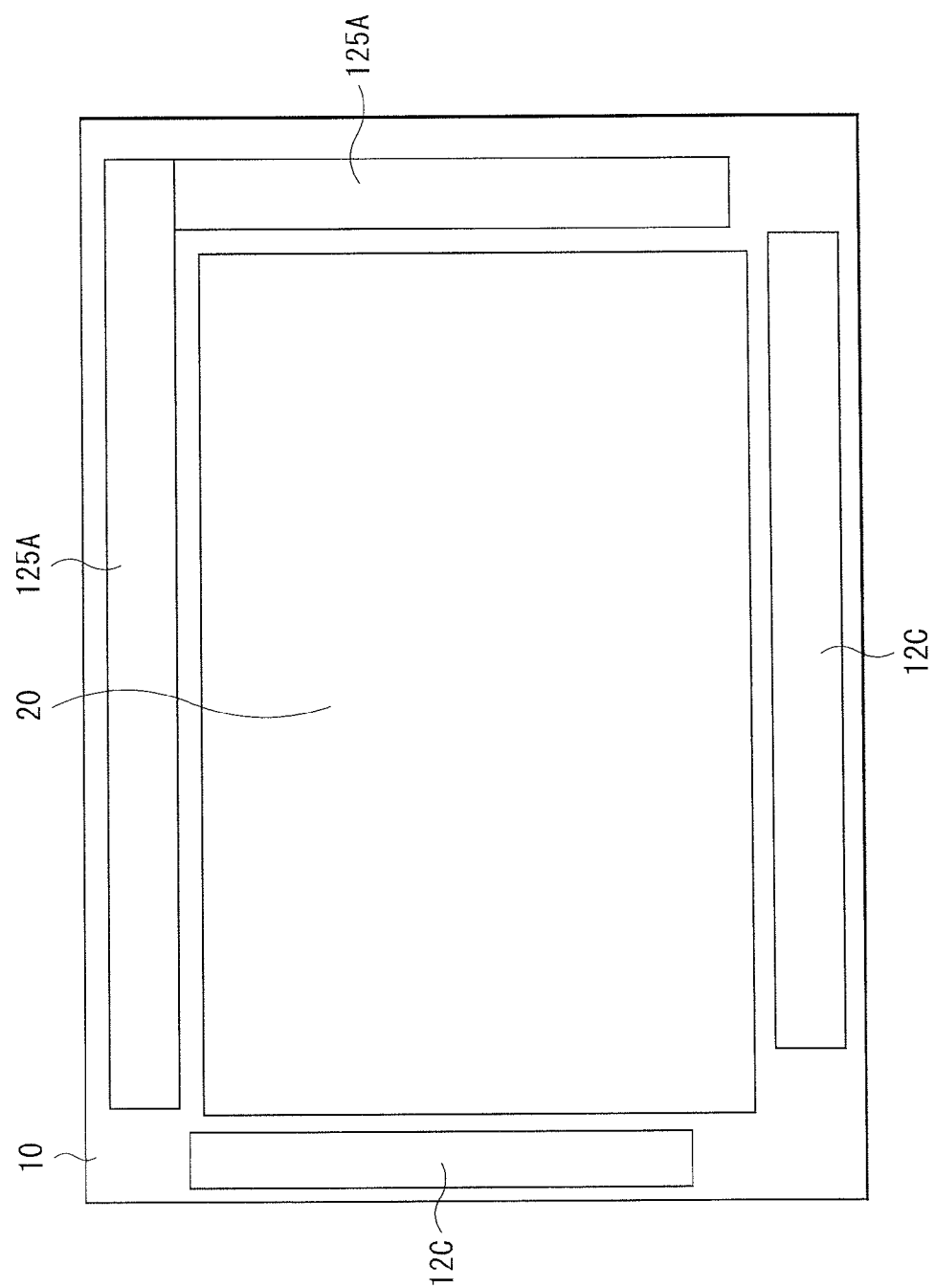
FIG. 14 is a plan view illustrating a state in which the device panel illustrated in FIG. 10 and the sealing panel illustrated in FIG. 11 are disposed to overlap each other.

FIG. 9 illustrates a cross-sectional configuration of a display unit (a display unit 100) according to a comparative example. In the display unit 100, as illustrated in FIG. 10, the device panel 10 is provided with, in addition to the second peripheral electrode 12C, a first peripheral electrode 125A to which the auxiliary wiring 25 is electrically connected. The display region 110 of the device panel 10 is surrounded by a wiring 125B electrically connected to the first peripheral electrode 125A. On the other hand, as illustrated in FIG. 11, the sealing panel 20 does not include a peripheral electrode at a position outside the display region 110. In the display region 110 of the sealing panel 20, for example, the auxiliary wiring 25 in a matrix may be provided as illustrated in FIG. 12. The auxiliary wiring 25 is electrically connected to the first peripheral electrode 125A (the wiring 125B) of the device panel 10, by a pillar 126 at a potion outside the display region 110 (FIGS. 9 and 13). As illustrated in FIG. 14, the sealing panel 20 and the device panel 10 are adhered to each other, so that the first peripheral electrode 125A and the second peripheral electrode 12C of the device panel 10 are exposed.

The display unit 100 as described above is manufactured as follows. First, in a manner similar to that of the above-described display unit 1, the TFT 12, the interlayer insulating film 12A, the wiring 12B, the second peripheral electrode 12C, the flattening layer 13, the first electrode 14, and the insulating film 15 are formed on the device substrate 11. In the display unit 100, the first peripheral electrode 125A is also formed on the device substrate 11 in this process.

Figure 15:
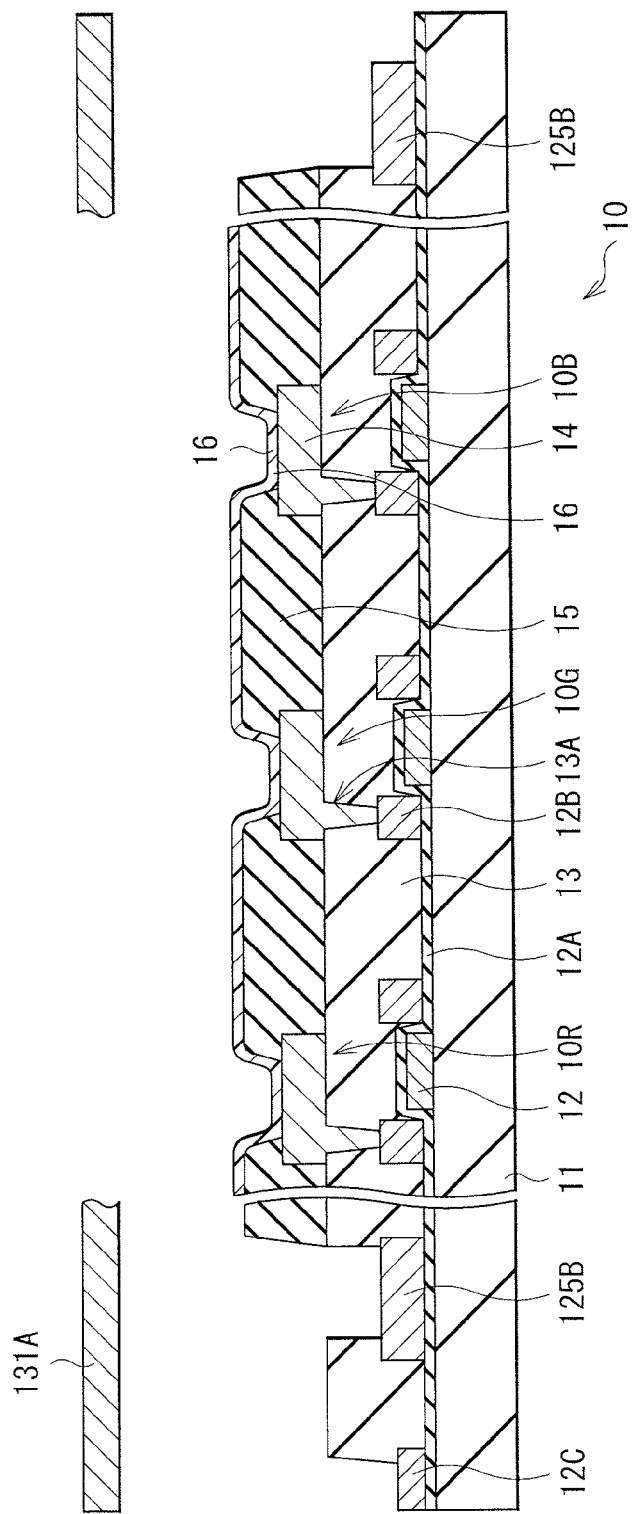
FIG. 15 is a cross-sectional diagram illustrating a process of manufacturing the display unit illustrated in FIG. 9.
Figure 16:
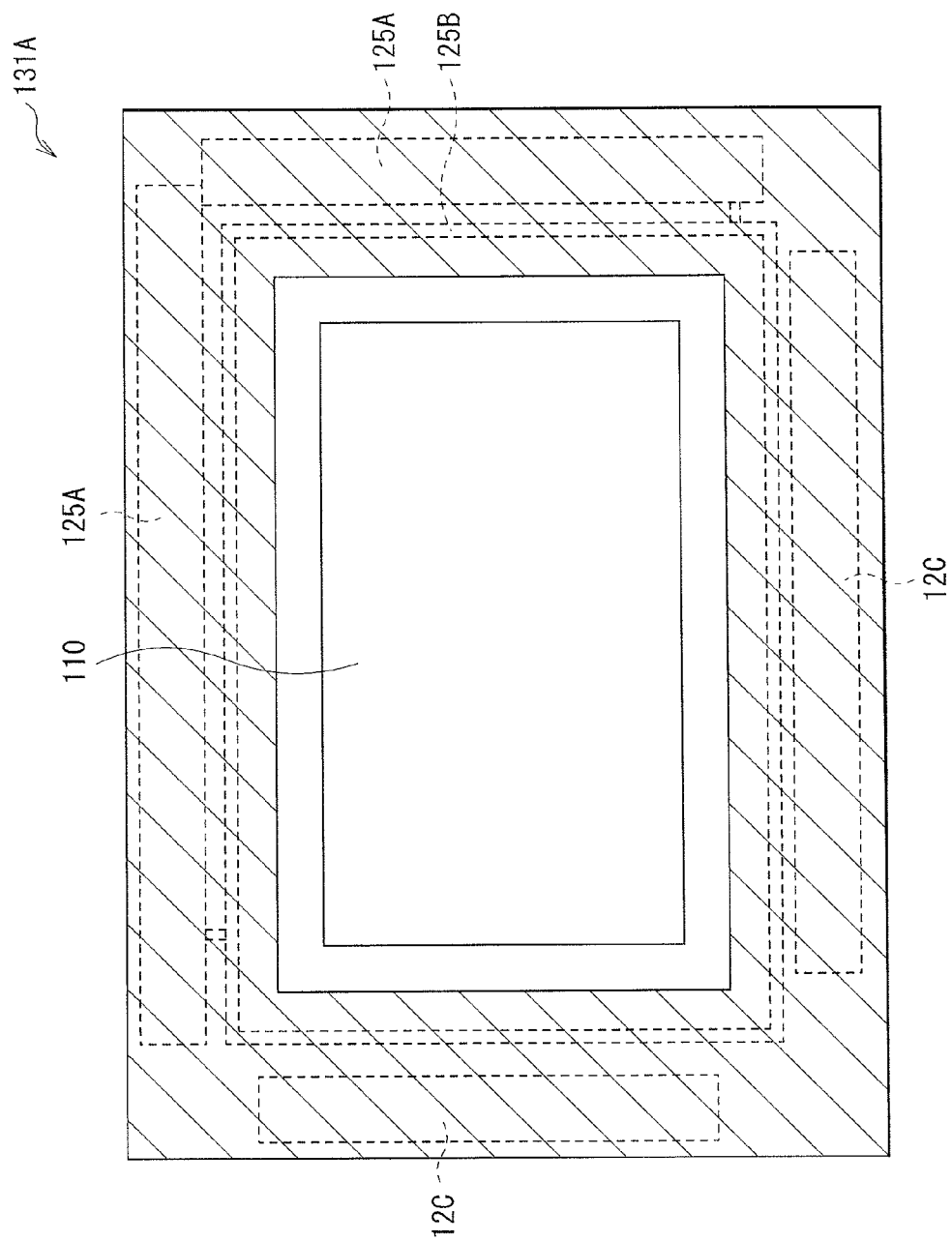
FIG. 16 is a plan view illustrating a configuration of a mask illustrated in FIG. 15.

Next, as illustrated in FIGS. 15 and 16, of the device substrate 11, a region provided with the first peripheral electrode 125A, the wiring 125B, and the second peripheral electrode 12C is covered with an area mask (a mask 131A), and then the organic layer 16 and the high-resistive layer 17 are formed. When the first peripheral electrode 125A, the wiring 125B, and the second peripheral electrode 12C are brought into contact with the material of the organic layer 16 with high resistance, power consumption may increase, for example, about 1.5-fold to about 2-fold. Therefore, it is necessary to prevent film formation of the organic layer 16 on the first peripheral electrode 125A and the second peripheral electrode 12C, by using the mask 131A.

Figure 17:
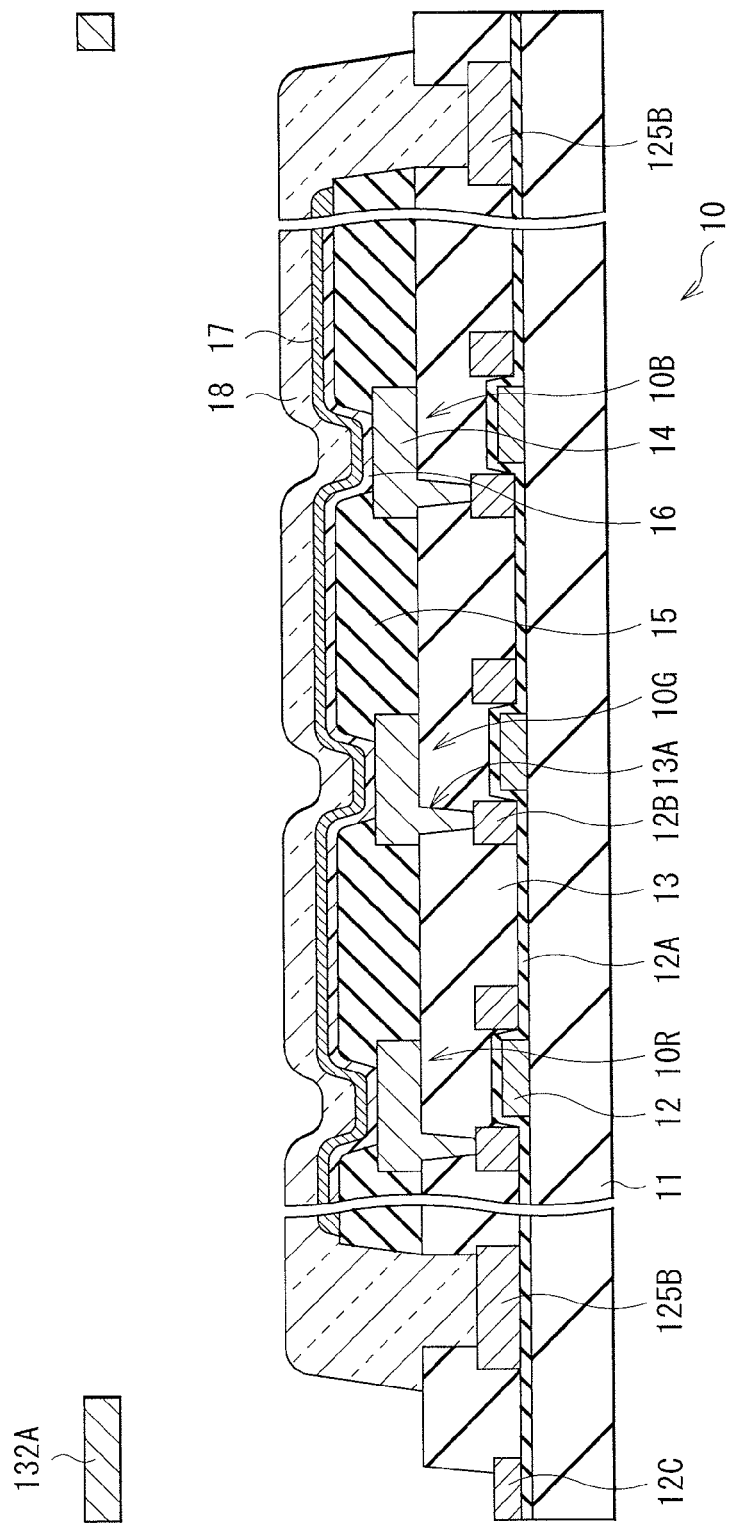
FIG. 17 is a cross-sectional diagram illustrating a process following the process in FIG. 15.
Figure 18:
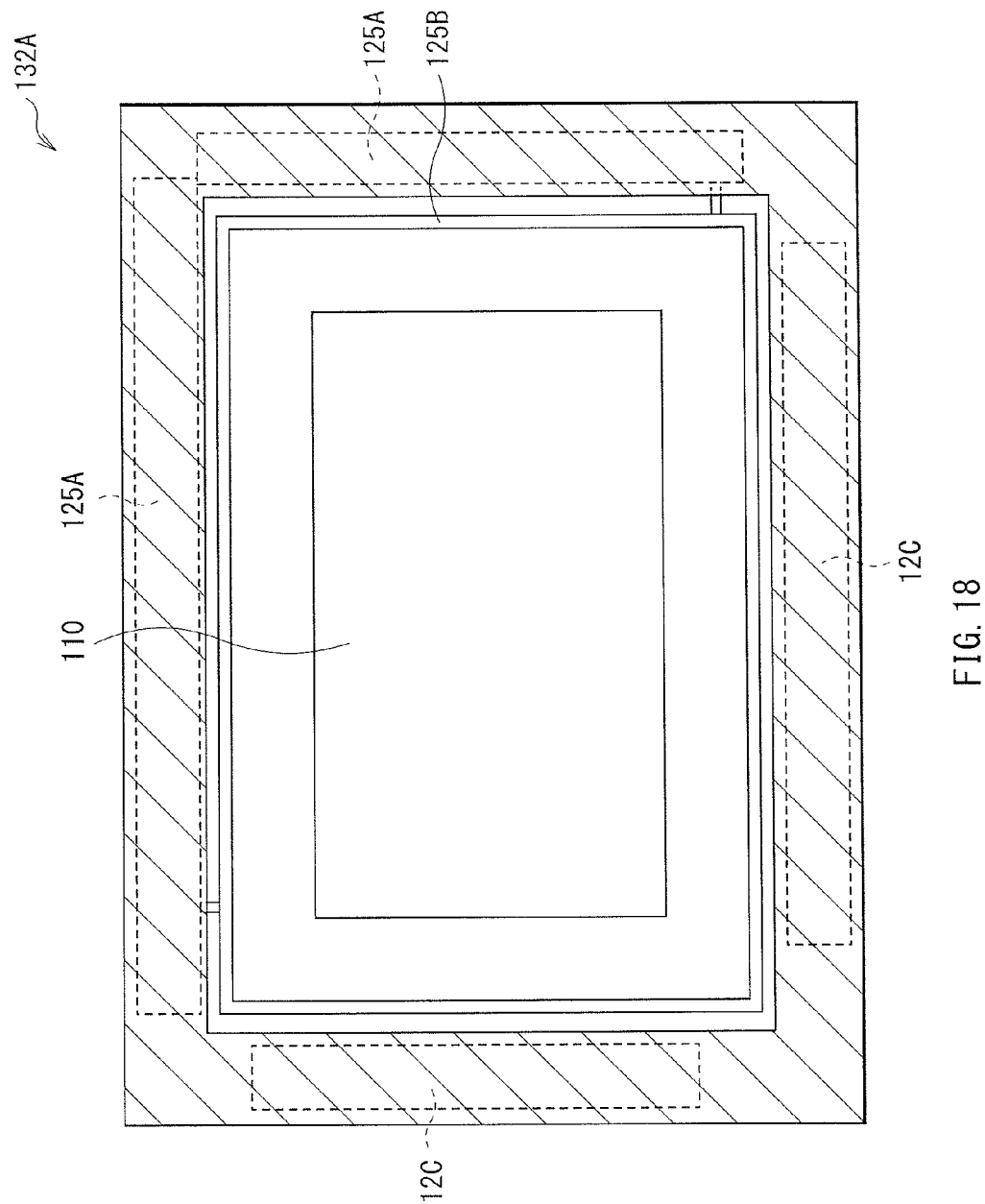
FIG. 18 is a plan view illustrating a configuration of a mask illustrated in FIG. 17.

After the organic layer 16 is provided, a mask 132A is provided above the device substrate 11, in place of the mask 131A (FIGS. 17 and 18). The mask 132A is an area mask shaped to cover the second peripheral electrode 12C, while exposing the wiring 125B. If the second peripheral electrode 12C is conducted with the first peripheral electrode 125A (the wiring 125B) through the second electrode 18, it is difficult to control driving of the organic light-emission devices 10R, 10G, and 10B. Therefore, the mask 132A is necessary to prevent film formation of the second electrode 18 on the second peripheral electrode 12C. After the mask 132A is provided, the second electrode 18 is deposited, so that the second electrode 18 and the first peripheral electrode 125A (the wiring 125B) are connected to each other electrically. In this way, in the display unit 100, at least two area masks (the mask 131A and the mask 132A) are necessary in the processes of forming the organic layer 16, the high-resistive layer 17, and the second electrode 18. The organic layer 16 and the high-resistive layer 17 may be formed using separate area masks, respectively.

Figure 19:
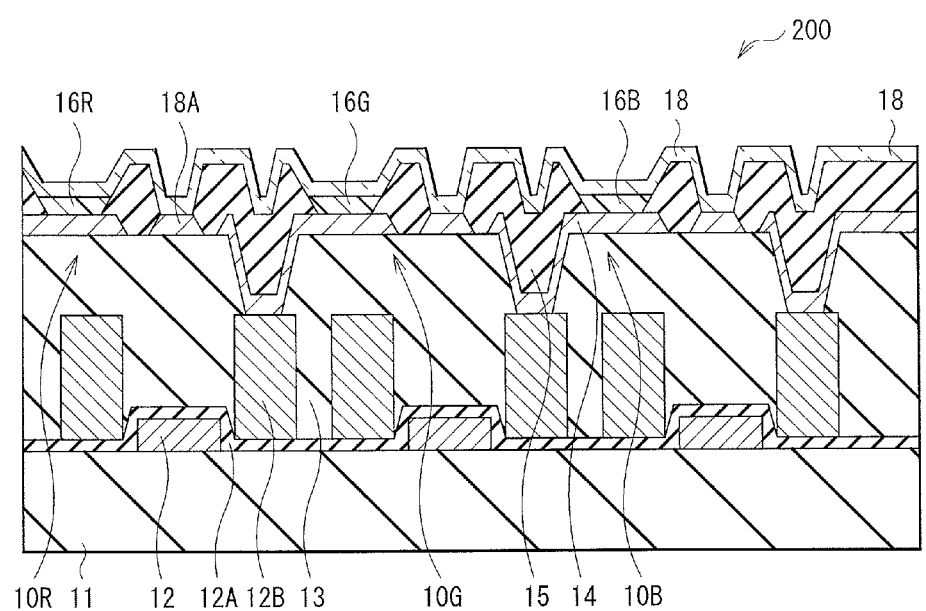
FIG. 19 is a cross-sectional diagram illustrating a configuration of a display unit including light emitting layers of a type colored in different colors.

It is conceivable that the process of manufacturing the display unit 100 may be simple, as compared with a process of manufacturing a display unit (a display unit 200) in which organic layers 16R, 16G, and 16B are colored in different colors for the organic light-emission devices 10R, 10G, and 10B, respectively. FIG. 19 illustrates a cross-sectional configuration of the display unit 200. In the display unit 200, for example, the organic layers 16R, 16G, and 16B may be formed by vapor deposition that causes a low-molecular-weight organic material to sublimate by high heat. In this process, in a device region except the desirable organic light-emission device 10R (or the organic light-emission device 10G or 10B) is provided with an area mask. This area mask may be, for example, a metal film having a thickness of 10 μm to 100 μm and provided with an opening. This opening may be formed by, for example, etching or electroforming. In the display unit 200 of large size and high definition, deflection of such an area mask or an error in mask size may pose a difficulty. In addition, it is difficult to form a minute area mask. Moreover, it is also difficult to align an area mask with the device substrate 11. In the display unit 200 as well, in a manner similar to that of the display unit 100, the second electrode 18 is deposited on the entire surface of the device substrate 11, after the organic layers 16R, 16G, and 16B are provided. In the display unit 200, the area mask is used when the organic layers 16R, 16G, and 16B are formed. Therefore, it is possible to provide the device panel 10 with an auxiliary wiring 18A for electrical connection with the second electrode 18. For example, the auxiliary wiring 18A may be provided at a position next to each of the organic light-emission devices 10R, 10G, and 10B, for each of the organic light-emission devices 10R, 10G, and 10B. The auxiliary wiring 18A is electrically connected to the first peripheral electrode (not illustrated) of the device substrate 11.

In the process of manufacturing each of the display units 100 and 200 described above, an area mask or a plurality of area masks are necessary, and manufacturing cost increases as the number of masks increases. The mask has a life. For example, a metal mask may have a life of 10 µm to 20 µm (it is necessary to replace the mask when various film formation materials accumulated on the mask reach a thickness of 10 µm to 20 µm). A display unit may be manufactured, for example, by depositing a light emitting layer of an organic layer to have a thickness of 0.2 µm to 0.3 µm, and a transparent conductive film becoming a second electrode to have a thickness of about 0.1 µm to about 1 µm. Characteristics of the light emitting layer easily deteriorate due to entrance of oxygen and moisture from outside and therefore, a thickness of 1 µm or more is necessary for the entire organic layer, for protection. Hence, it is necessary to replace a mask, each time ten to one hundred of display units are manufactured. Such frequent replacement of the mask increases running cost as well as the time necessary for manufacturing.

In contrast, in the display unit 1, the first peripheral electrode 25A is provided on the substrate (the sealing substrate 21) different from the device substrate 11 where the organic layer 16 and the second electrode 18 are formed. This allows the area mask (the mask 131A in FIGS. 15 and 16), which covers the first peripheral electrode 25A in film formation of the organic layer 16 and the second electrode 18, not to be provided. Therefore, it is possible to lower manufacturing cost, by reducing the number of masks to be used.

Further, in the display units 100 and 200, one mask is repeatedly used many times and therefore, a deposited material on the mask may fall on the device substrate 11, which may cause a display failure. Furthermore, the mask and the device substrate 11 are brought close to or into contact with each other, to prevent the film formation materials from entering therebetween. Therefore, the mask itself may damage the organic light-emission devices.

In addition, in the display unit 100, it is necessary to provide a margin region outside the display region 110, by taking into consideration an error of alignment between the device substrate 11 and the mask 131A or 132A. This margin region is secured also in consideration of occurrence of a so-called entering phenomenon, in which a film formation material enters through a gap between the mask 131A or 132A and the device substrate 11. In the display unit 100, since such a margin region is necessary, an outside bezel region of the display region 110 tends to become large. In other words, the proportion of effective pixels (the display region 110) in the device substrate 11 decreases, and the bezel becomes wide. The device panel 10 of the display unit 100 is provided with the peripheral electrodes (the first peripheral electrode 125A and the second peripheral electrode 12C) outside the display region 110. Therefore, if a removable protective film (for example, the protective film 31 in FIG. 8B) is used in place of the masks 131A and 132A, the organic light-emission devices 10R, 10G, and 10B in the display region 110 may deteriorate due to a chemical and the like used for removal. Similarly, if the protective film is physically removed, the organic light-emission devices 10R, 10G, and 10B may also deteriorate by being exposed to the atmosphere due to this removal.

In contrast, in the display unit 1, there is one peripheral electrode (the second peripheral electrode 12C) on the device substrate 11. Therefore, in the film formation of the organic layer 16 and the second electrode 18, the second peripheral electrode 12C may be covered with the removable protective film 31, in place of the area mask. Hence, in the display unit 1, a mask is allowed not to be provided in the film formation of the organic layer 16 and the second electrode 18, which makes it possible to prevent display failure and expansion of the bezel region due to use of a mask. The display unit 1 as described above is also suitable for application to a field of apparatuses such as tablet terminals and mobile units that are expected to have a slimmer bezel.

[Method of Manufacturing Sealing Panel 20]

Figure 20A:
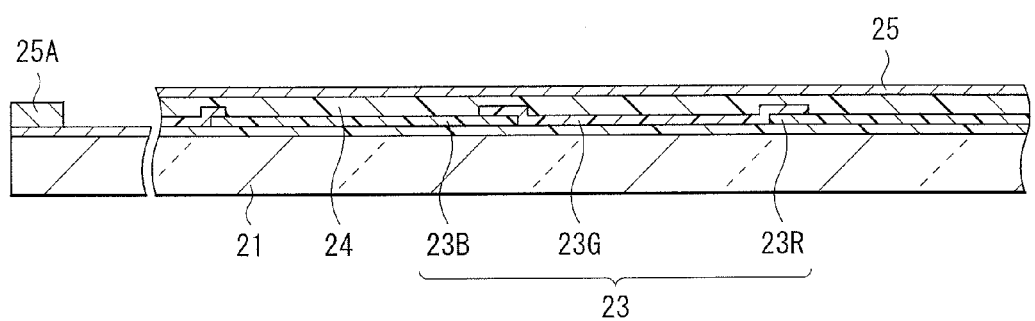
FIG. 20A is a cross-sectional diagram illustrating a process of manufacturing the sealing panel illustrated in FIG. 1.
Figure 20B:
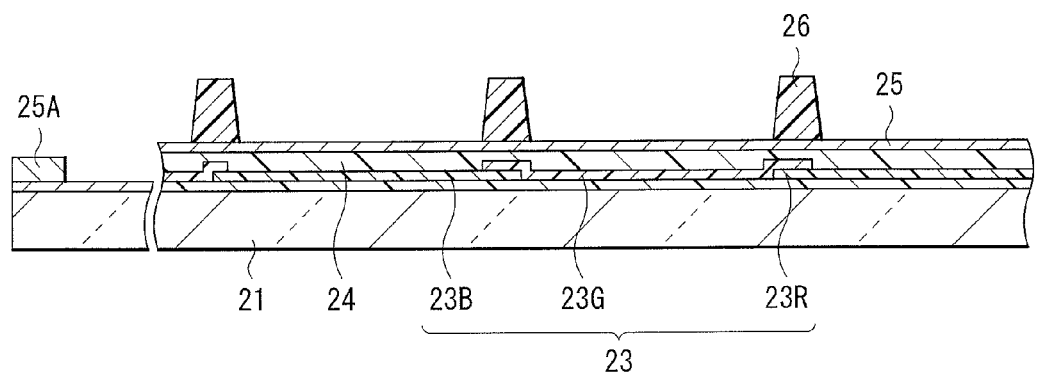
FIG. 20B is a cross-sectional diagram illustrating a process following the process in FIG. 20A.

The sealing panel 20 of the display unit 1 may be formed as follows, for example (FIGS. 20A and 20B). First, the material of the light-shielding layer 22 may be deposited on the entire surface of the sealing substrate 21, and then may be patterned into a matrix by using, for example, a photolithography process. Next, the red filter 23R, the green filter 23G, and the blue filter 23B are sequentially formed to be patterned on the sealing substrate 21 provided with the light-shielding layer 22. Subsequently, the overcoat layer 24 is deposited on the entire surface of the sealing substrate 21, and then the auxiliary wiring 25 and the first peripheral electrode 25A are formed on the overcoat layer 24 (FIG. 20A).

After the auxiliary wiring 25 is provided, the pillar 26 is formed to be electrically connected to the auxiliary wiring 25, as illustrated in FIG. 20B. The pillar 26 may be formed utilizing a technique used for a photo spacer in a display such as a liquid crystal display. Specifically, at first, for example, acrylic resin or the like may be applied onto the sealing substrate 21 and then shaped into a desirable shape by using a photolithography process. Subsequently, a film of ITO may be formed by, for example, sputtering on the entire surface of the sealing substrate 21 including the shaped resin, so that the pillar 26 is formed. The sealing panel 20 is completed by the above-described processes.

[Process of Adhering Device Panel 10 and Sealing Panel 20]

Figure 22:
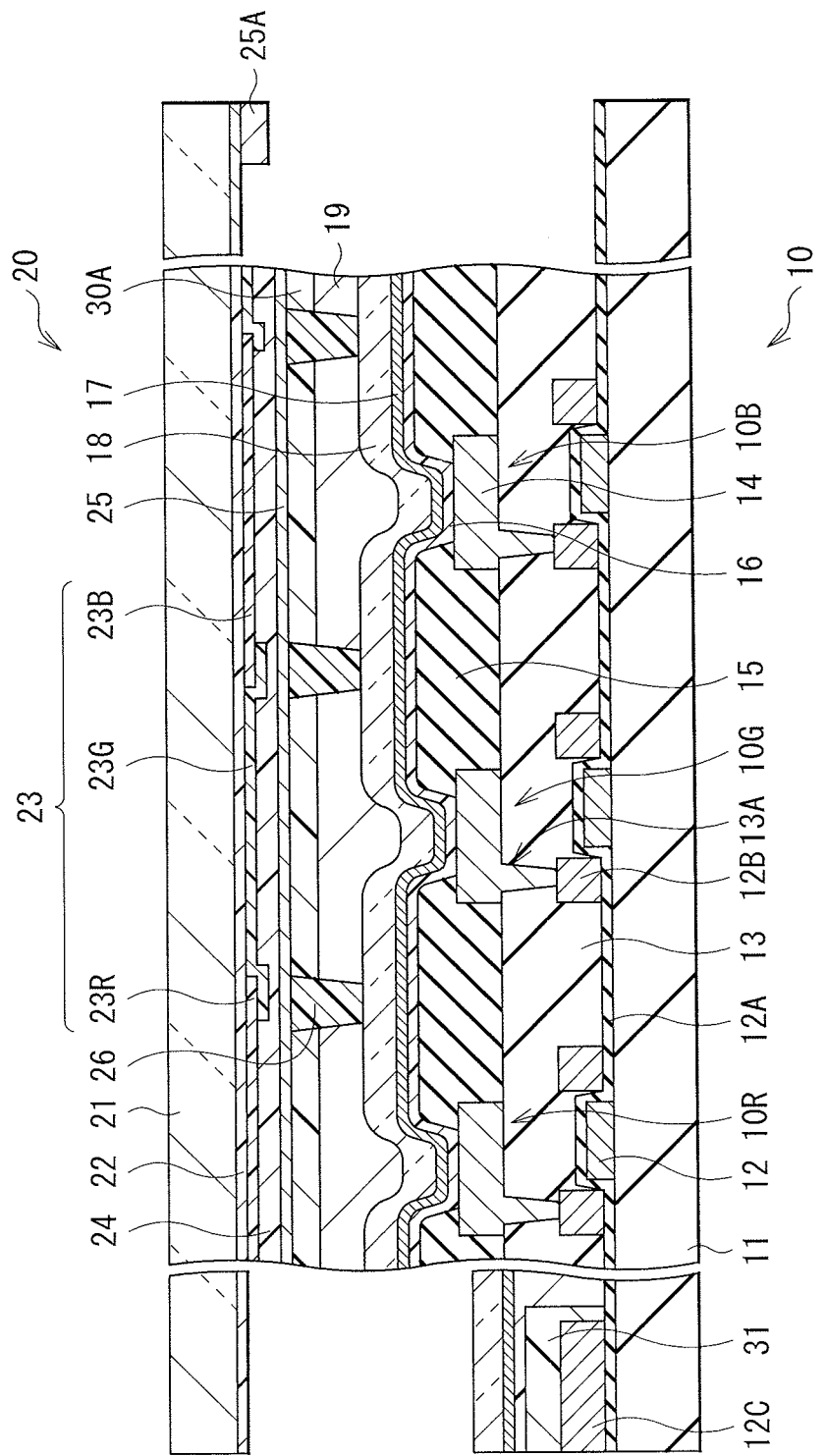
FIG. 22 is a cross-sectional diagram illustrating a process following the process in FIG. 21C.

Using a one-drop-fill (ODF) process as illustrated in FIGS. 21A to 21C, for example, the device panel 10 and the sealing panel 20 formed as described above may be adhered to each other (FIG. 22). Specifically, an upper plate 41A and a lower plate 41B in a pair are prepared in a vacuum chamber, and then the sealing panel 20 and the device panel 10 are fixed to a surface of the upper plate 41A and a surface of the lower plate 41B that face each other, respectively. Next, a peripheral edge portion of the device panel 10 on the lower plate 41B is surrounded by the sealing resin 30B, and the filling resin 30A is dropped in a region surrounded by the sealing resin 30B (FIG. 21A). In this process, a plurality of droplets of the filling resin 30A are positioned with uniform spacings. Subsequently, the sealing panel 20 and the device panel 10 are adhered to each other in the vacuum chamber (FIG. 21B), and then a nitrogen ($N_2$) atmosphere is formed in the chamber to apply pressure to the device panel 10 and the sealing panel 20.

This makes it possible to provide the filling resin 30A between the device panel 10 and the sealing panel 20 without a gap (FIG. 21C).

After the sealing panel 20 and the device panel 10 are adhered to each other (FIG. 22), the protective film 31 is removed. Also, the device substrate 11 and the sealing substrate 21 are cut so that the first peripheral electrode 25A of the sealing panel 20 and the second peripheral electrode 12C of the device panel 10 are exposed from the device substrate 11 and the sealing substrate 21, respectively (FIG. 7). The display unit 1 illustrated in FIG. 1 is completed by the above-described process.

[Operation of Display Unit]

In the display unit 1, when a driving current corresponding to an image signal of each color is applied to each of the organic light-emission devices 10R, 10G, and 10B, an electron and a positive hole are injected into the organic layer 16 through the first electrode 14 and the second electrode 18. The electron and the positive hole are recombined in the light emitting layer included in the organic layer 16, to cause emission of light. This light is extracted after passing through the second electrode 18, the color filter 23, and the sealing substrate 21. In this way, for example, an image of full color of R, G, and B may be displayed on the display unit 1. In addition, by application of an electric potential corresponding to the image signal to one end of the capacitor Cs in this image display operation, an electric charge corresponding to the image signal is stored in the capacitor Cs.

A surplus current after the emission of light flows from the second electrode 18 of the organic light-emission devices 10R, 10G, and 10B, to the first peripheral electrode 25A of the sealing panel 20 side, through the pillar 26 and the auxiliary wiring 25. The first peripheral electrode 25A may be electrically connected to the common power supply line (GND), for example (FIG. 3).

On the other hand, in the display unit 100 (FIG. 9), the first peripheral electrode 125A is provided on the device panel 10 side. Therefore, a current, which has flowed from the second electrode 18 of the organic light-emission devices 10R, 10G, and 10B to the auxiliary wiring 25 of the sealing panel 20 through the pillar 26, returns to the device panel 10 side through the pillar 126 provided outside the display region 110, and arrives at the first peripheral electrode 125A.

In this way, in the display unit 100, the current from the second electrode 18 travels twice between the device panel 10 and the sealing panel 20 through the pillar 26. In contrast, in the display unit 1, it is possible to reduce the number of times of traveling to once. Therefore, a resistance value of a current path from the second electrode 18 to the first peripheral electrode 25A is lowered, which makes it possible to suppress power consumption of the display unit 1.

[Functions and Effects of Display Unit]

Further, here, the sealing panel 20 includes the first peripheral electrode 25A. Therefore, the number of masks to be used in forming the organic light-emission devices 10R, 10G, and 10B on the device substrate 11 is reduced. This suppresses an increase in running cost and an increase in manufacturing time, thereby allowing a reduction in cost.

Furthermore, in forming the organic light-emission devices 10R, 10G, and 10B, the second peripheral electrode 12C on the device substrate 11 is covered with the removable protective film 31. Therefore, it is possible to form the organic layer 16, the high-resistive layer 17, and the second electrode 18 without using a mask. This makes it possible to prevent display failure and expansion of a bezel region due to use of a mask. Moreover, using the single-use protective film 31 allows a further reduction in cost.

In addition, the number of times of current traveling between the device panel and the sealing panel 20 through the pillar is reduced. Therefore, the resistance value of the current path from the second electrode 18 to the first peripheral electrode 25A is lowered, which allows suppression in the power consumption of the display unit 1.

As described above, in the display unit 1 of the present embodiment, the first peripheral electrode 25A is formed on the sealing substrate 21. Therefore, it is possible to manufacture the display unit 1 at a lower cost.

Next, modifications of the above-described embodiment and other embodiments will be described. In the following description, the same components as those of the above-described embodiment will be provided with the same reference numerals as those thereof, and will not be described as appropriate.

[Modification 1]

Figure 23:
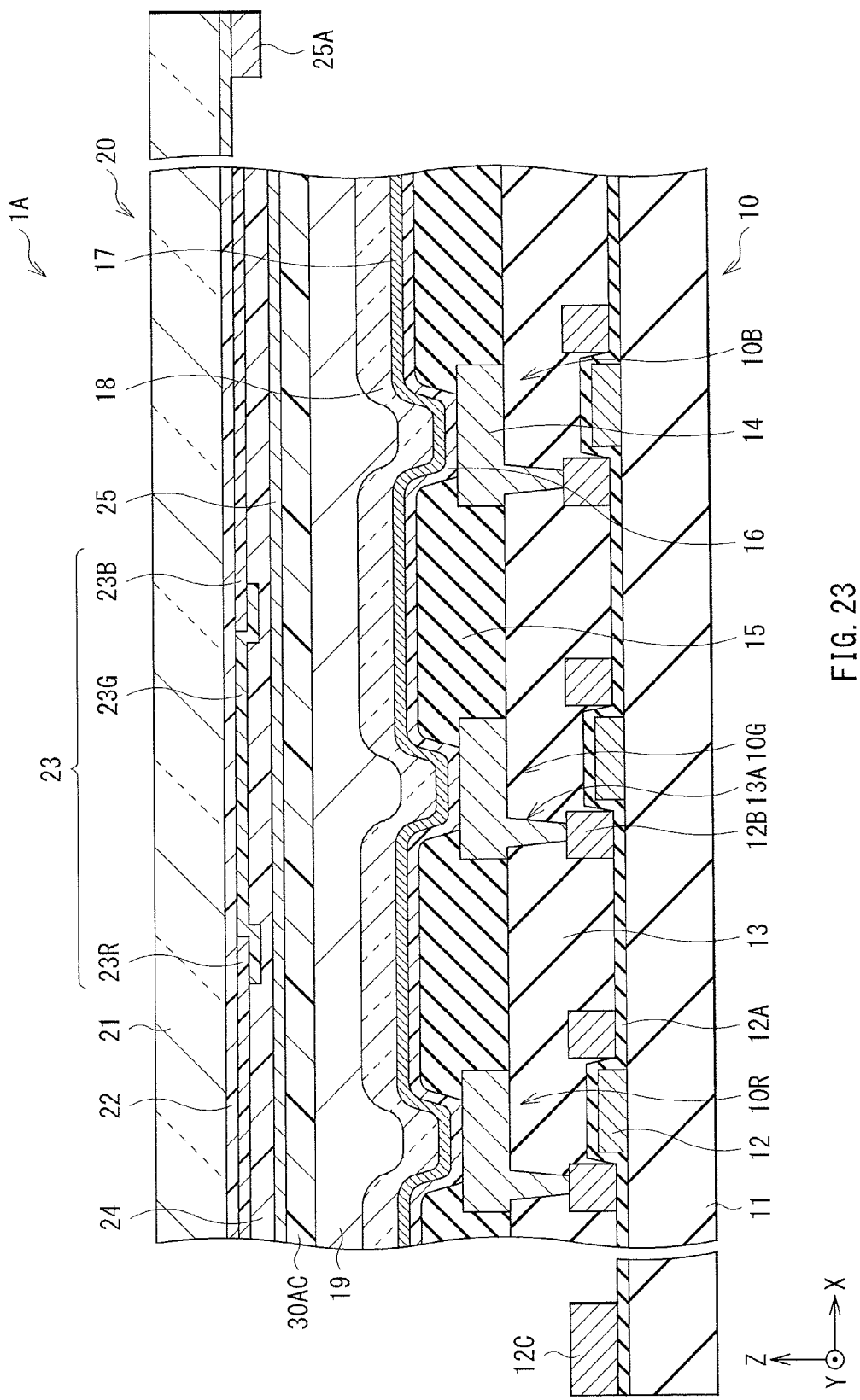
FIG. 23 is a cross-sectional diagram illustrating a configuration of a display unit according to Modification 1.

FIG. 23 illustrates a cross-sectional configuration of a display unit (a display unit 1A) according to Modification 1. The display unit 1A includes a conductive resin 30AC between the device panel 10 and the sealing panel 20. In the display unit 1A, it is possible to omit the process of forming the pillar (the pillar 26 in FIG. 1) used to connect the second electrode 18 of the organic light-emission devices 10R, 10G, and 10B to the auxiliary wiring 25 electrically. Except this point, the display unit 1A has a configuration similar to that of the display unit 1, and has similar functions and effects as well.

The conductive resin 30AC may be formed, for example, using a conductive resin material for the filling resin 30A (FIG. 21A, etc.) used in the process of manufacturing the above-described display unit 1. The conductive resin 30AC may have electric resistivity of, for example, $1\times10^6$ $\Omega\cdot$m to $1\times10^8$ $\Omega\cdot$m. When the conductive resin 30AC having electric resistivity within this range is used, the process of forming the high-resistive layer 17 may be omitted. In addition, it is possible to connect the organic layer 16 and the auxiliary wiring 25 electrically by the conductive resin 30AC, without providing the second electrode 18.

[Modification 2]

Figure 24:
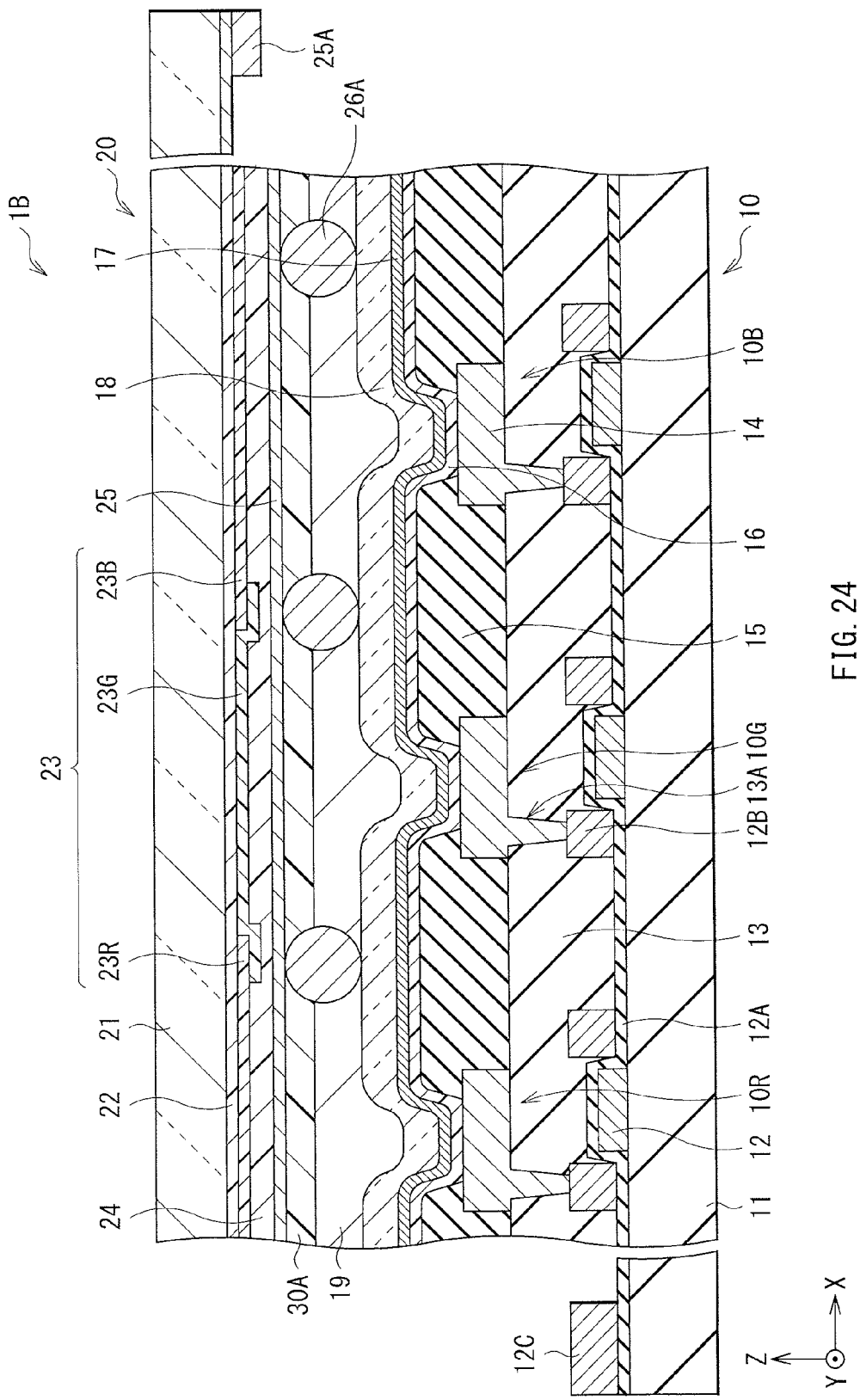
FIG. 24 is a cross-sectional diagram illustrating a configuration of a display unit according to Modification 2.

FIG. 24 illustrates a cross-sectional configuration of a display unit (a display unit 1B) according to Modification 2. The display unit 1B includes a conductive ball 26A in place of the pillar 26 (FIG. 1) of the above-described display unit 1. By the conductive ball 26A, the auxiliary wiring 25 is electrically connected to the second electrode 18 of the organic light-emission devices 10R, 10G, and 10B. Except this point, the display unit 1B has a configuration similar to that of the display unit 1, and has similar functions and effects as well.

The conductive ball 26A may be, for example, a substantially spherical conductor of 3 μm to 20 μm in diameter. The conductive ball 26A may be configured, for example, by covering a surface of a resin material such as acrylic resin, with a conductive metallic material such as gold (Au), titanium (Ti), and silver (Ag). This surface may be covered with a light-transmissive transparent electrode material such as ITO and IZO. Use of the transparent conductive material makes it possible to suppress an influence on optical properties of the display unit 1B, even when the conductive ball 26A is disposed in the light emission regions 10RE, 10GE, and 10BE of the organic light-emission devices 10R, 10G, and 10B. The distance between the device panel 10 and the sealing panel 20 may also be adjusted by the size of the diameter of the conductive ball 26A. When the protective layer 19 has an insulation property, the conductive ball 26A is provided in a connection hole, of the protective layer 19, that is formed beforehand.

Reliability of electrical connection between the conductive ball 26A and the auxiliary wiring 25 may be increased by providing a transparent conductive film such as ITO and IZO on the entire surface (a surface facing the device substrate 11) of a sealing substrate 21. Even when the conductive ball 26A is not in contact with the auxiliary wiring 25, the conductive ball 26A and the auxiliary wiring 25 are electrically connected to each other by providing the conductive film on the entire surface of the sealing substrate 21. Therefore, the conductive ball 26A and the auxiliary wiring 25 are allowed to be connected electrically to each other with reliability.

[Modification 3]

Figure 25:
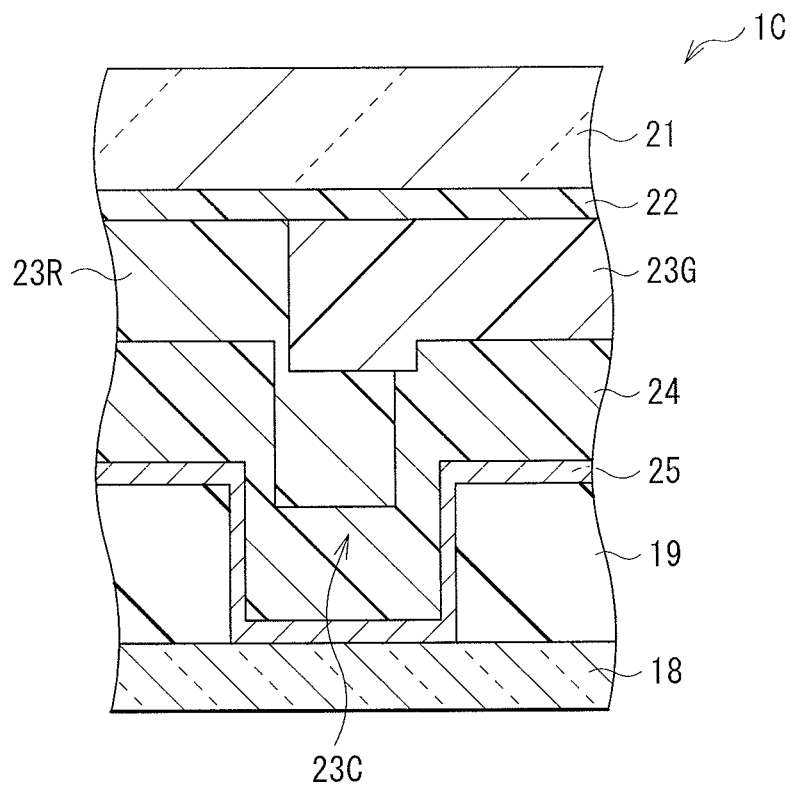
FIG. 25 is a cross-sectional diagram illustrating a configuration of a display unit according to Modification 3.

FIG. 25 illustrates a cross-sectional configuration of a main part of a display unit (a display unit 1C) according to Modification 3. In the display unit 1C, the auxiliary wiring 25 of the sealing panel 20 is brought into contact with the second electrode 18 of the device panel 10, by a projection section (a projection section 23C) formed of the color filter 23. Except this point, the display unit 1C has a configuration similar to that of the display unit 1, and has similar functions and effects as well.

End parts of the red filter 23R, the green filter 23G, and the blue filter 23B next to each other are disposed to overlap each other in a non-light emission region, namely, at a position facing the pattern of the light-shielding layer 22. In this overlap region of the red filter 23R, the green filter 23G, and the blue filter 23B, the color filter 23 is projected convexly towards the device panel 10 side, so that the projection section 23C is formed. As a result, the auxiliary wiring 25 on the sealing panel 20 side is in contact with the second electrode 18 on the device panel 10 side, so that these panels are electrically connected to each other. In the display unit 1C as described above, it is possible to omit the process of forming the pillar.

[Modification 4]

Figure 26:
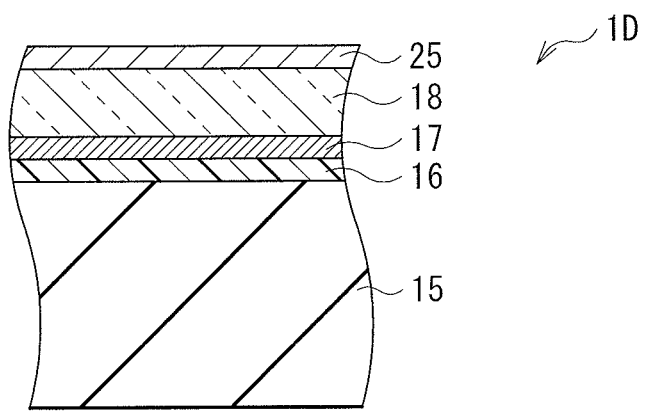
FIG. 26 is a cross-sectional diagram illustrating a configuration of a display unit according to Modification 4.

FIG. 26 illustrates a cross-sectional configuration of a main part of a display unit (a display unit 1D) according to Modification 4. In the display unit 1D, the second electrode 18 and the auxiliary wiring 25 are electrically connected to each other, using the insulating film 15. Except this point, the display unit 1D has a configuration similar to that of the display unit 1, and has similar functions and effects as well.

The thickness of the insulating film 15 between the first electrodes 14 next to each other is larger than the thickness of the first electrode 14, and the surface of the insulating film 15 is closer to the sealing panel 20 side than the surface of the first electrode 14 is. Utilizing this thickness of the insulating film 15, the second electrode 18 on the insulating film 15 may be brought into contact with the auxiliary wiring 25 of the sealing panel 20 to establish electrical connection therebetween. In the display unit 1D as described above, it is possible to omit the process of forming the pillar.

Second Embodiment

Figure 27:
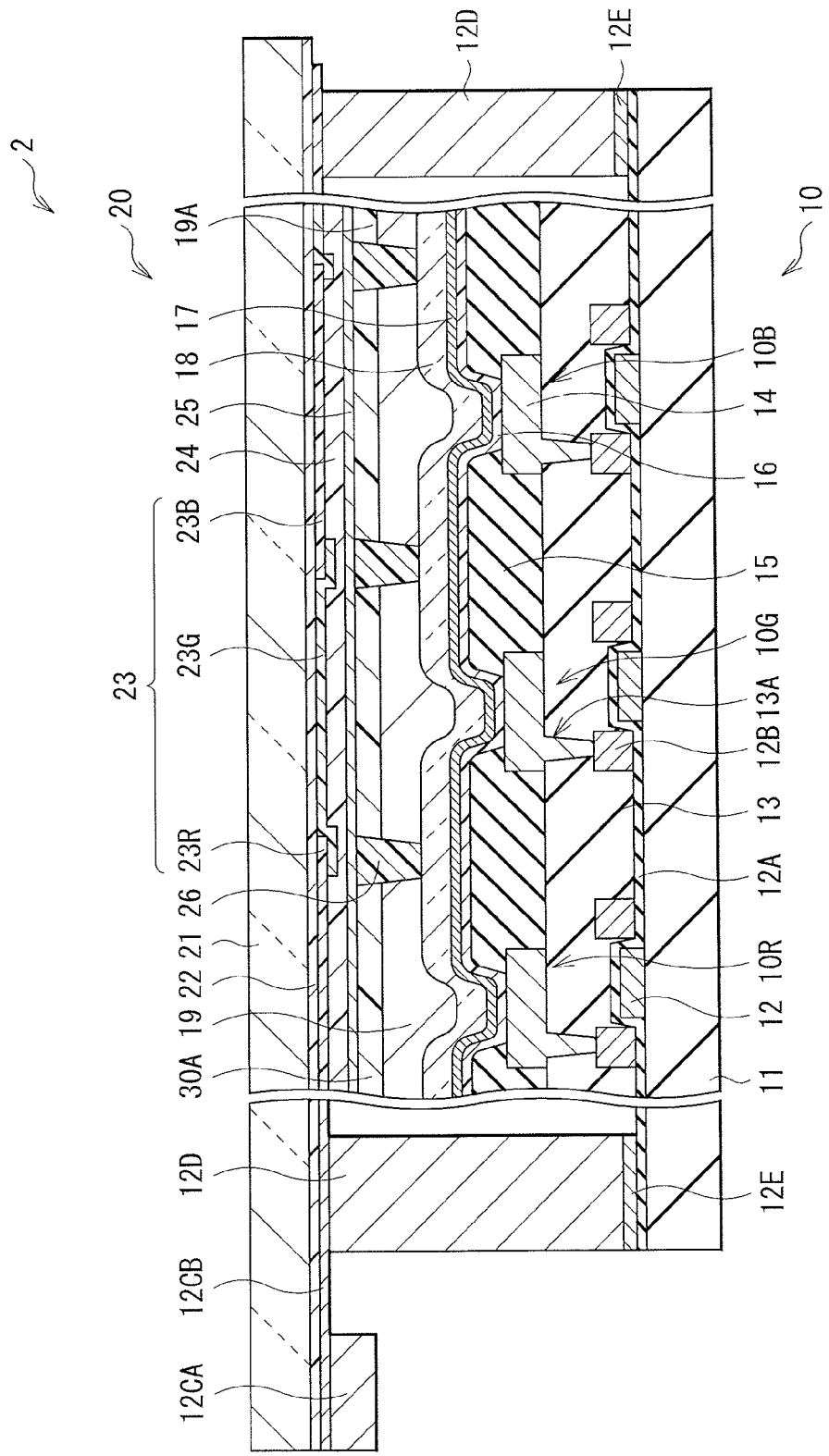
FIG. 27 is a cross-sectional diagram illustrating a configuration of a display unit according to a second embodiment of the present application.
Figure 28:
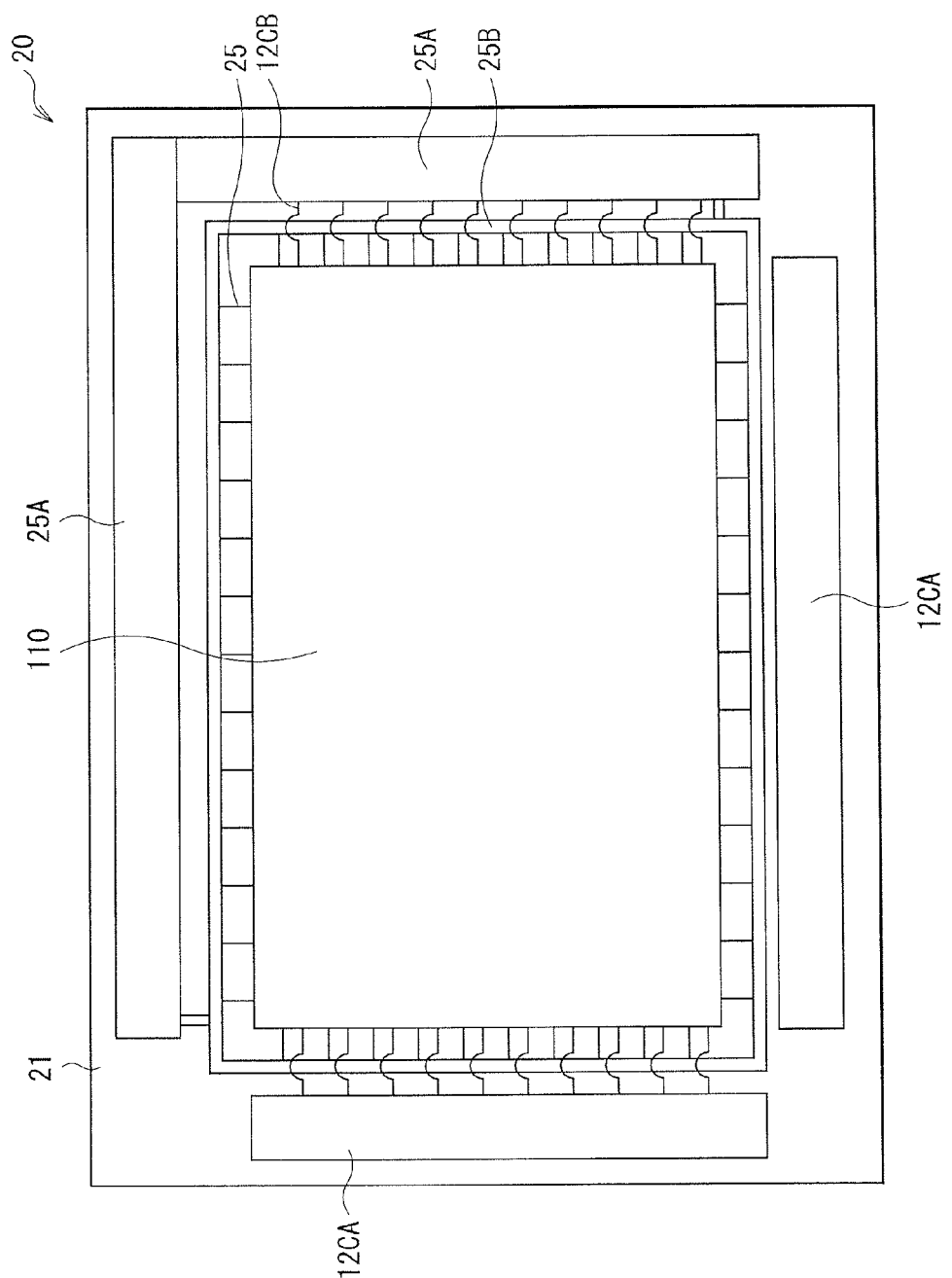
FIG. 28 is a plan view illustrating a configuration of a sealing panel illustrated in FIG. 27.

FIG. 27 illustrates a cross-sectional configuration of a display unit (a display unit 2) according to a second embodiment of the present application. In the display unit 2, the sealing panel 20 is provided with, together with the first peripheral electrode 25A, a second peripheral electrode (a second peripheral electrode 12CA) (FIG. 28 to be described later). Except this point, the display unit 2 has a configuration similar to that of the display unit 1, and has similar functions and effects as well.

As with the second peripheral electrode 12C of the display unit 1, the second peripheral electrode 12CA may be, for example, a bonding pad electrode provided to send a drive signal to each of the organic light-emission devices 10R, 10G, and 10B. The second peripheral electrode 12CA is provided outside the display region 110, as illustrated in FIG. 28. The second peripheral electrode 12CA may be disposed, for example, at each of two sides of the peripheral edge of the sealing substrate 21, that are different from the sides where the first peripheral electrode 25A are provided. The second peripheral electrode 12CA is electrically connected to an auxiliary wiring 12CB (a second wiring) of the sealing panel 20. In the display region 110 of the sealing panel 20, the auxiliary wiring 25 electrically connected to the first peripheral electrode 25A may be provided in a manner similar to that of the display unit 1, for example.

Figure 29:
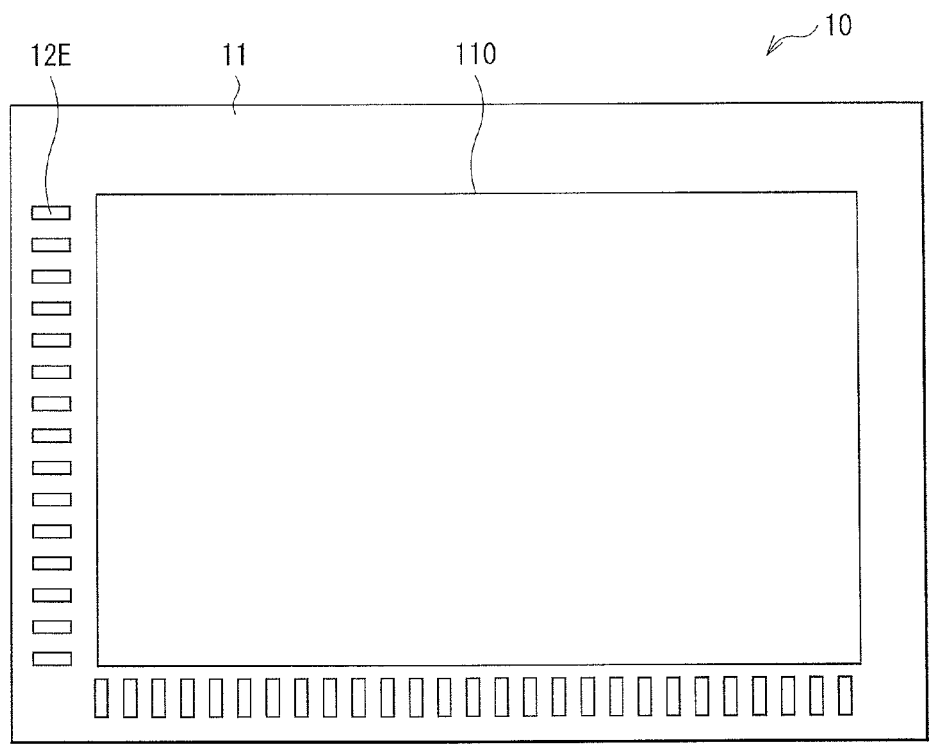
FIG. 29 is a plan view illustrating a configuration of a device panel illustrated in FIG. 27.

On the other hand, the device panel 10 of the display unit 2 includes an electrode 12E (a conductor) electrically connected to the TFT 12 of each of the organic light-emission devices 10R, 10G, and 10B (FIG. 27). As illustrated in FIG. 29, the electrode 12E is disposed outside the display region 110, and may be formed, for example, in the same process as the process of forming the gate electrode or the source-drain electrode of the TFT 12. The electrode 12E may be formed in the same process as the process of forming the wiring 12B. The TFT 12, the wiring 12B, and the electrode 12E as described above may be formed by, for example, a lithography process. Therefore, it is possible to establish connection between the terminals reliably, by preventing occurrence of disconnection and crosstalk. For the electrode 12E as described above, for example, a metallic material of low resistance such as aluminum, silver, copper, gold, nickel, molybdenum, titanium, and chromium. For example, the electrode 12E may be preferably configured by covering a surface of aluminum with molybdenum. Molybdenum is resistant to oxidizing and therefore, reliability of the electrode 12E improves.

The display unit 2 includes an anisotropic conductive film (ACF) 12D (a second connection section) provided between the device substrate 11 and the sealing substrate 21, to connect the electrode 12E and the auxiliary wiring 12CB electrically. Therefore, a drive signal is transmitted to each of the TFTs 12 through the auxiliary wiring 12CB, the anisotropic conductive film 12D, and the electrode 12E, from a wiring substrate (not illustrated) connected to the second peripheral electrode 12C.

The anisotropic conductive film 12D has resistance that changes depending on a current flowing direction. For example, in the anisotropic conductive film 12D, the resistance is small when a current flows in a lamination direction in which the device substrate 11 and the sealing substrate 21 are laminated. In addition, in the anisotropic conductive film 12D, a current does not flow in a direction parallel to the surface of each of the device substrate 11 and the sealing substrate 21. Therefore, it is possible to cause each of the organic light-emission devices 10R, 10G, and 10B to serve as a display device, by transmitting the driving current to each of the organic light-emission devices 10R, 10G, and 10B. The anisotropic conductive film 12D may be configured of, for example, thermosetting resin mixed with minute metal particles having conductivity. The metal particle may be, for example, a spherical particle of 5 μm to 15 μm in diameter, and includes a nickel layer, a gold plating layer, and an insulating layer in this order from a central part to circumference. The thermosetting resin including such conductive particles is provided between connection terminals (between the auxiliary wiring 12CB and the electrode 12E), and then the provided thermosetting resin is pressurized while being heated. The heating may be performed using, for example, a heater or the like, and the pressurization may be performed using, for example, an elastic pad made of a material such as rubber. A position where the terminal is provided is projected convexly from the surface of the substrate. Therefore, when the thermosetting resin is thus pressurized, the conductive particles located at a position facing the terminal is pressurized hard, and brought into contact with each other while overlapping each other. As a result, the plating layers of the respective conductive particles are connected to each other to form a conductive path. On the other hand, in the conductive particles in a part except the terminal, insulation between the particles is maintained by the insulating layers. In this way, anisotropy of the anisotropic conductive film 12D is formed. In place of the anisotropic conductive film 12D, a paste-shaped anisotropic conductive material (anisotropic conductive paste (ACP)) may be used. The auxiliary wiring 12CB and the electrode 12E may be electrically connected to each other by a conductive ball (FIG. 24) having anisotropy, or may be connected by a projection section (FIG. 25) of the color filter 23, or the insulating film 15 (FIG. 26).

Figure 30:
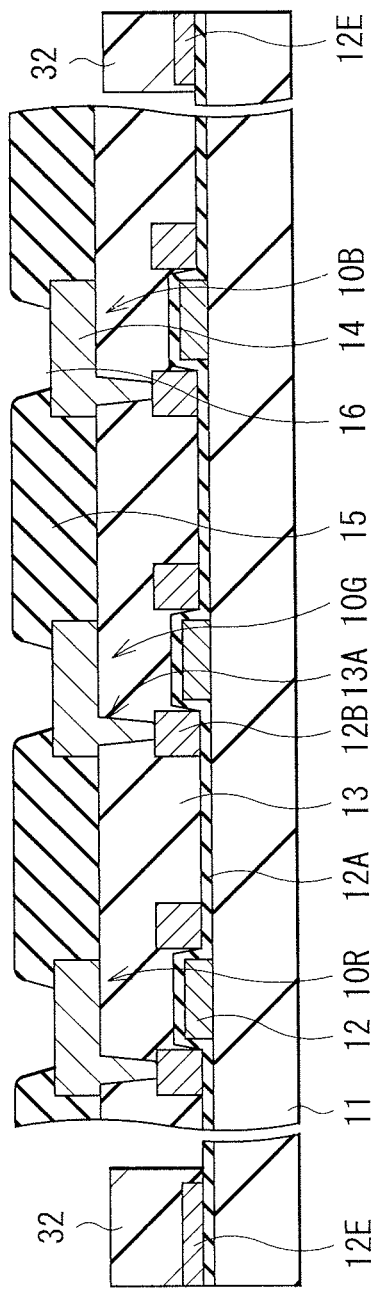
FIG. 30 is a cross-sectional diagram illustrating a process of manufacturing the display unit illustrated in FIG. 27.
Figure 31:
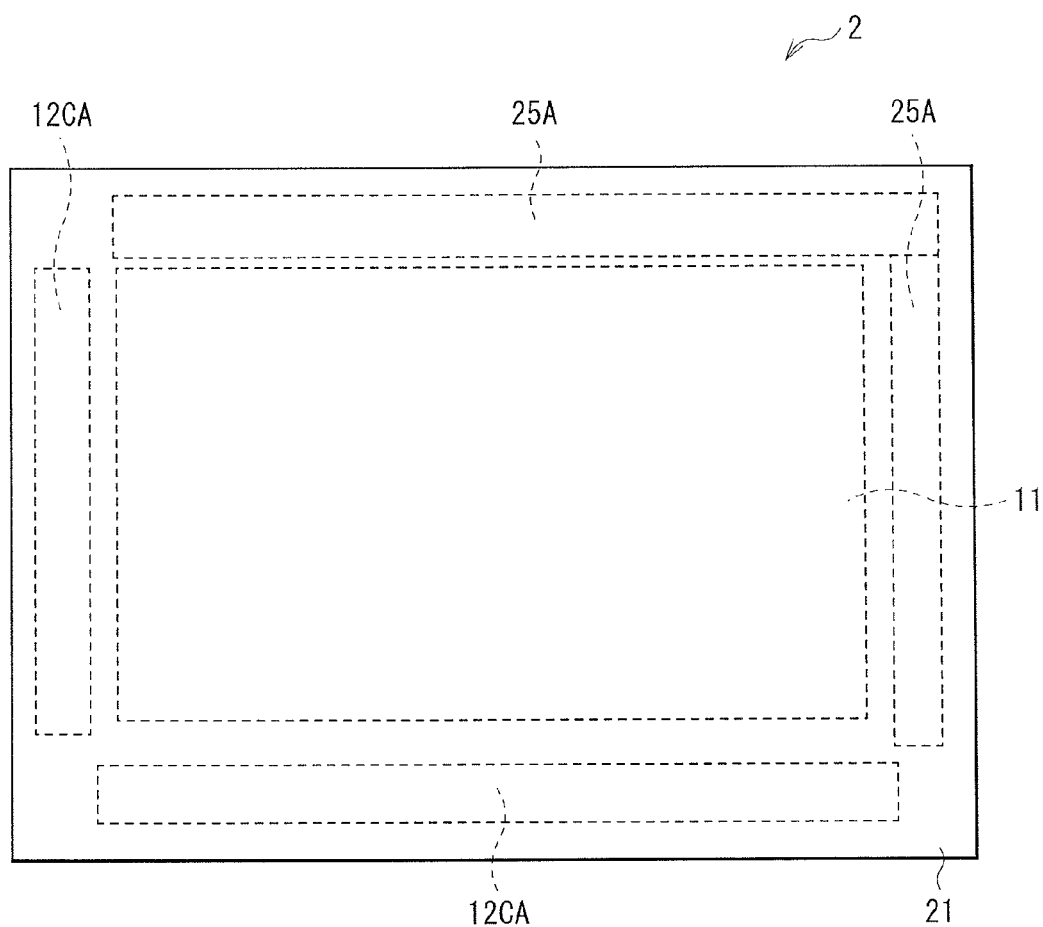
FIG. 31 is a plan view illustrating a state in which the sealing panel illustrated in FIG. 28 and the device panel illustrated in FIG. 29 are disposed to overlap each other.

The display unit 2 may be manufactured as follows, for example (FIGS. 30 and 31). First, the TFT 12, the interlayer insulating film 12A, the wiring 12B, the electrode 12E, and the flattening layer 13 are formed on the device substrate 11. Next, the first electrode 14 and the insulating film 15 are formed on the flattening layer 13, and then the electrode 12E is covered with a protective film 32, as illustrated in FIG. 30. The protective film 32 is provided to prevent contact between the electrode 12E and each of the organic layer 16, the high-resistive layer 17, and the second electrode 18. A film similar to the protective film 31 (FIG. 8B) used in the process of manufacturing the above-described display unit 1 may be used for the protective film 32. In place of the protective film 32, an area mask (not illustrated) may be used. After the protective film 32 is provided, the organic layer 16, the high-resistive layer 17, the second electrode 18, and the protective layer 19 are formed in a manner similar to that of the display unit 1. On the other hand, in addition to the first peripheral electrode 25A, the second peripheral electrode 12CA and the auxiliary wiring 12CB are formed on the sealing substrate 21. The auxiliary wiring 12CB may be formed, for example, in the same process as the process of forming the auxiliary wiring 25. Thus forming a plurality of wirings (the auxiliary wirings 12CB and 25) in the same process improves productivity, which allows suppression in cost. The light-shielding layer 22, the color filter 23, and the overcoat layer 24 may be formed on the sealing substrate 21, in a manner similar to that described above for the above-described display unit 1. The sealing panel 20 and the device panel 10 thus formed may be adhered to each other using, for example, the ODF process (FIGS. 21A to 21C), and the device substrate 11 is cut so that the first peripheral electrode 25A and the second peripheral electrode 12CA on the sealing panel 20 are exposed (FIG. 31). The display unit 2 is completed by the above-described processes.

In this way, in the display unit 2, the second peripheral electrode 12CA is provided at the sealing panel 20. Therefore, it is possible to reduce the number of masks to be used in the processes of forming the organic layer 16, the high-resistive layer 17, and the second electrode 18. Hence, it is possible to reduce the cost, by suppressing an increase in running cost and an increase in manufacturing time. Further, it is also possible to form the organic layer 16, the high-resistive layer 17, and the second electrode 18 without using a mask by using the protective film 32. This makes it possible to prevent display failure and expansion of a bezel region due to use of a mask.

Third Embodiment

Figure 32:
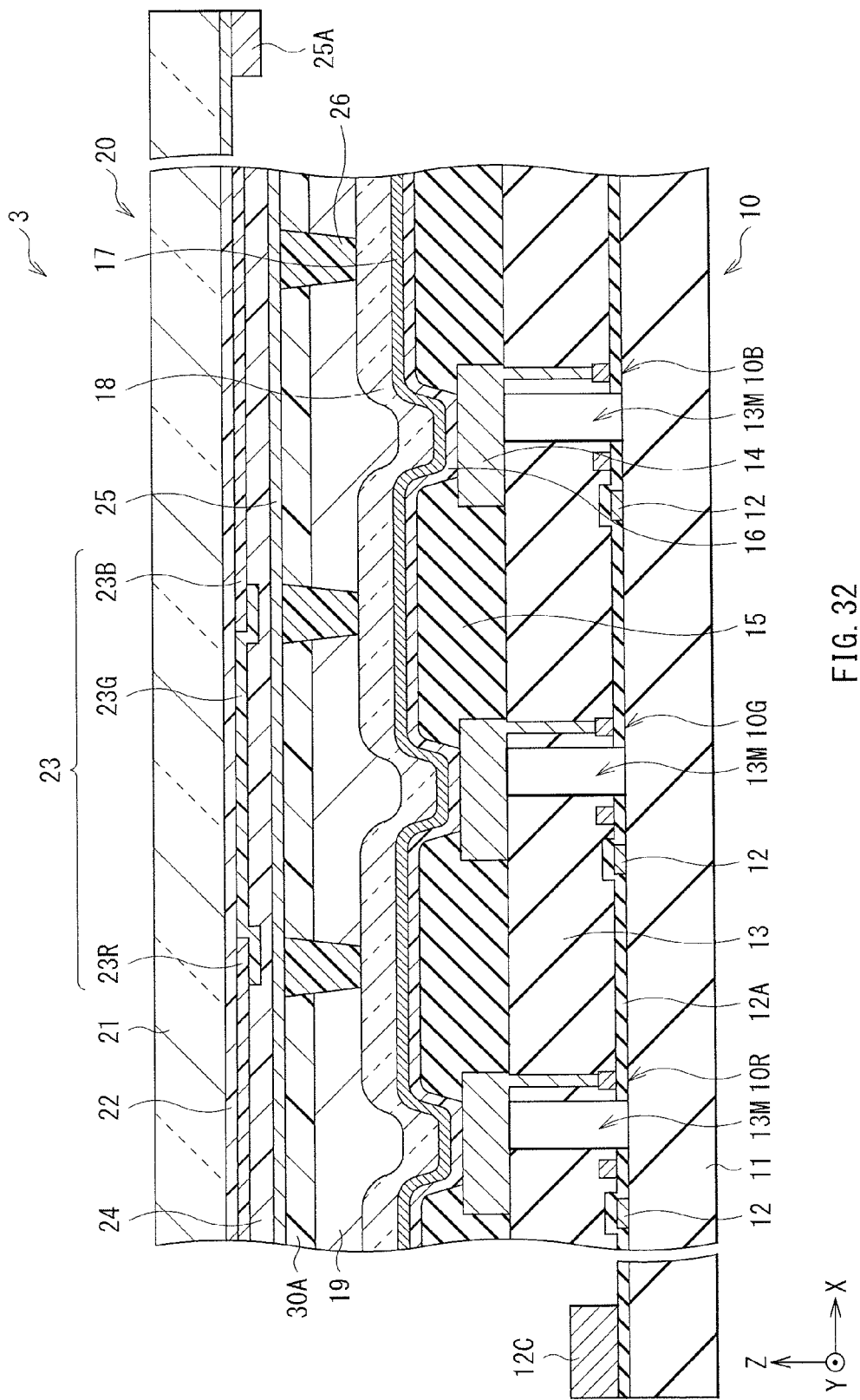
FIG. 32 is a cross-sectional diagram illustrating a configuration of a display unit according to a third embodiment of the present application.

FIG. 32 illustrates a cross-sectional configuration of a display unit (a display unit 3) according to a third embodiment of the present application. The display unit 3 is a bottom-emission-type display unit in which light is extracted from the device substrate 21 side. Except this point, the display unit 2 has a configuration similar to that of the display unit 1, and has similar functions and effects as well.

The device panel 10 of the display unit 3 has an opening 13M at a position facing each of the organic light-emission devices 10R, 10G, and 10B, and light generated in each of the organic light-emission devices 10R, 10G, and 10B is extracted through the opening 13M. For example, the opening 13M may pass through the flattening layer 13 and the interlayer insulating film 12A. In the present embodiment, as with the display unit 1, the first peripheral electrode 25A electrically connected to the auxiliary wiring 25 is provided on the sealing panel 20. This reduces the number of masks to be used in forming the organic light-emission devices 10R, 10G, and 10B, thereby allowing suppression in cost. In addition, as compared with the case (the display unit 100 in FIG. 9) in which the first peripheral electrode 125A is provided on the device panel 10 side, a design load of the device panel 10 is reduced. Therefore, it is possible to increase an aperture ratio of the opening 13M. Hence, it is possible to enhance luminance of the organic light-emission devices 10R, 10G, and 10B.

In the display unit 3, the light is extracted from the device panel 10 side and therefore, it is possible to design the sealing panel 20 more freely. For example, the auxiliary wiring 25 and the pillar 26 may be provided in the light emission region (the light emission regions 10RE, 10GE, and 10BE in FIG. 4). Alternatively, a conductive film may be provided on the entire surface of the sealing substrate 21 to configure the auxiliary wiring 25.

Figure 33:
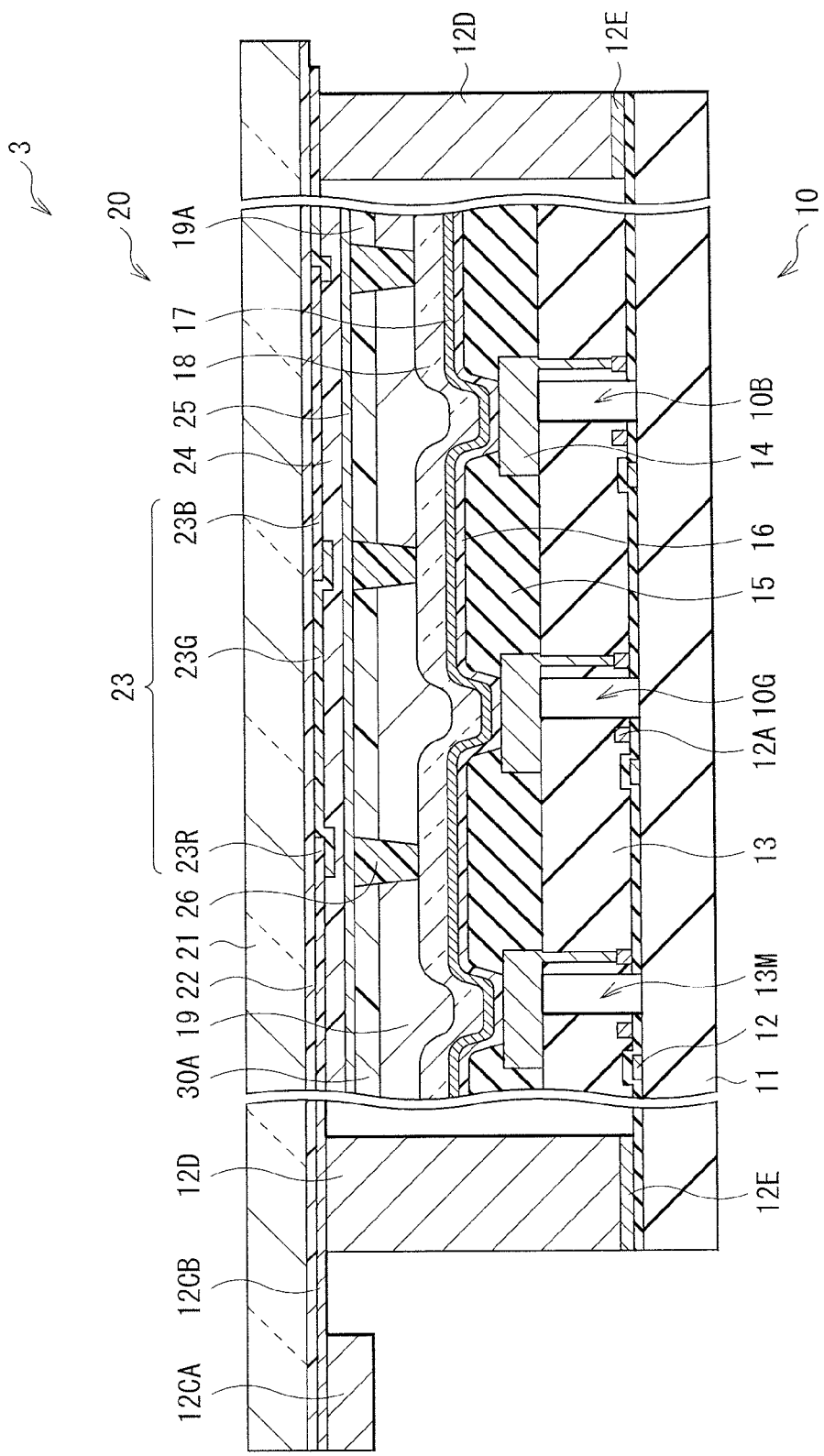
FIG. 33 is a cross-sectional diagram illustrating another example of the display unit illustrated in FIG. 32.

As illustrated in FIG. 33, the second peripheral electrode (the second peripheral electrode 12CA) of the display unit 3 may be provided on the sealing panel 20.

APPLICATION EXAMPLES

Examples of application of the display units (the display units 1, 1A, 1B, 1C, 1D, 2, and 3) as described above to electronic apparatuses will be described below. Examples of the electronic apparatuses may include television apparatuses, digital cameras, laptop personal computers, mobile terminal apparatuses such as mobile phones, and video cameras. In other words, the above-described display units are applicable to electronic apparatuses in all fields which display externally-inputted image signals or internally-generated image signals as still or moving images.

[Module]

Figure 34:
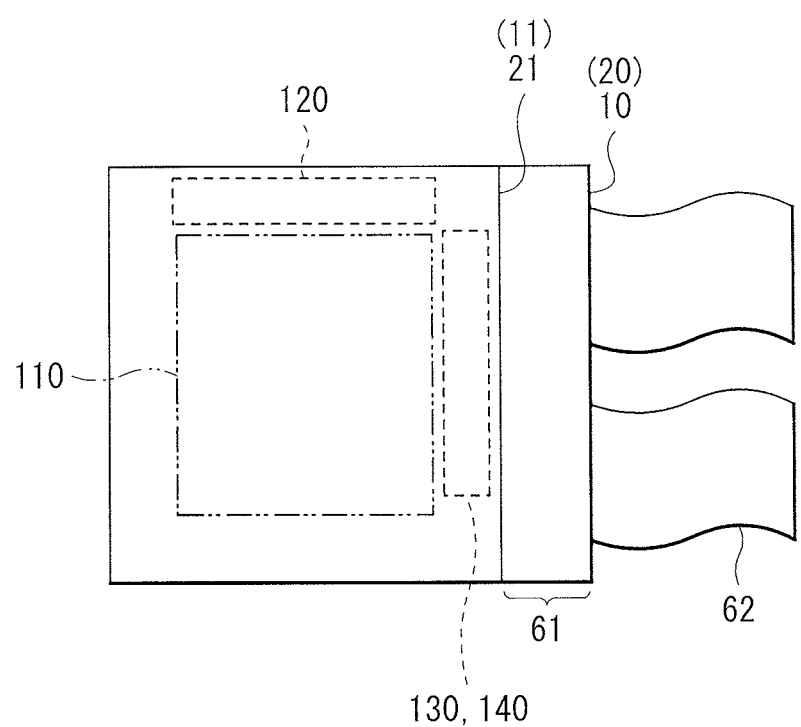
FIG. 34 is a plan view illustrating a schematic configuration of a module including the display unit illustrated in FIG. 1, etc.

Any of the above-described display units may be incorporated in various kinds of electronic apparatuses including Application examples 1 to 7 to be described below, as a module illustrated in FIG. 34, for example. In this module, for example, a region 61 exposed from the sealing substrate 21 or the device substrate 11 may be provided at one side of the device panel 10 or the sealing panel 20. In this exposed region 61, external connection terminals (such as the first peripheral electrode and the second peripheral electrode) are formed by extending wirings of the signal-line driving circuit 120, the scanning-line driving circuit 130, and the power-supply-line driving circuit 140. These external connection terminals may be provided with a flexible printed circuit (FPC) 62 for input and output of signals.

Application Example 1

Figure 35A:
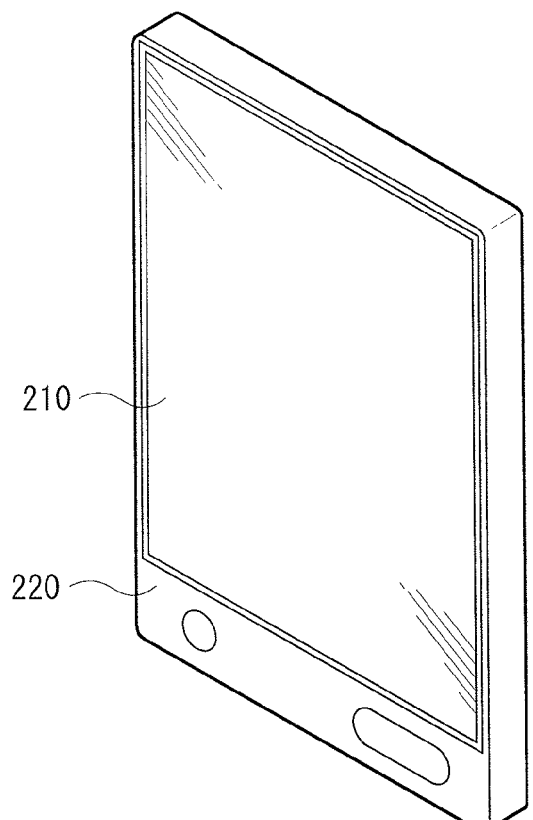
FIG. 35A is a perspective view illustrating an appearance of Application example 1.
Figure 35B:
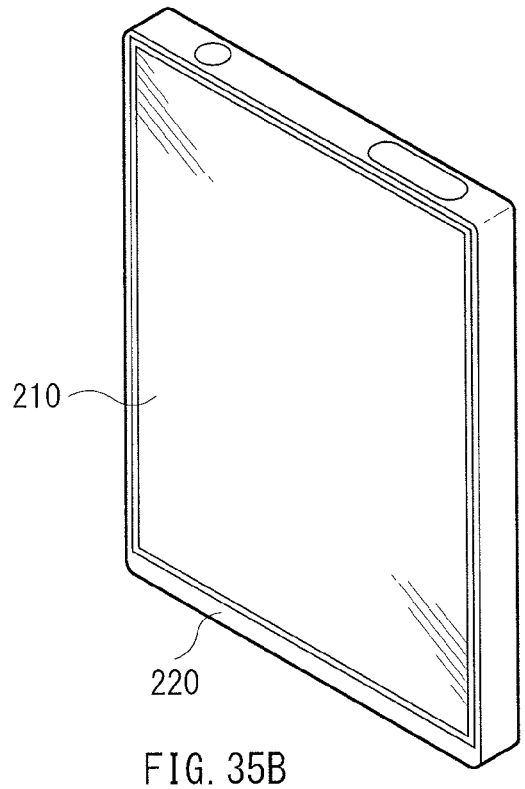
FIG. 35B is a perspective view illustrating another example of the appearance of Application example 1.

FIG. 35A and FIG. 35B each illustrate an appearance of an electronic book to which the display unit of any of the above-described embodiments is applied. This electronic book may include, for example, a display section 210 and a non-display section 220. The display section 210 is configured using the display unit of any of the above-described embodiments.

Application Example 2

Figure 36:
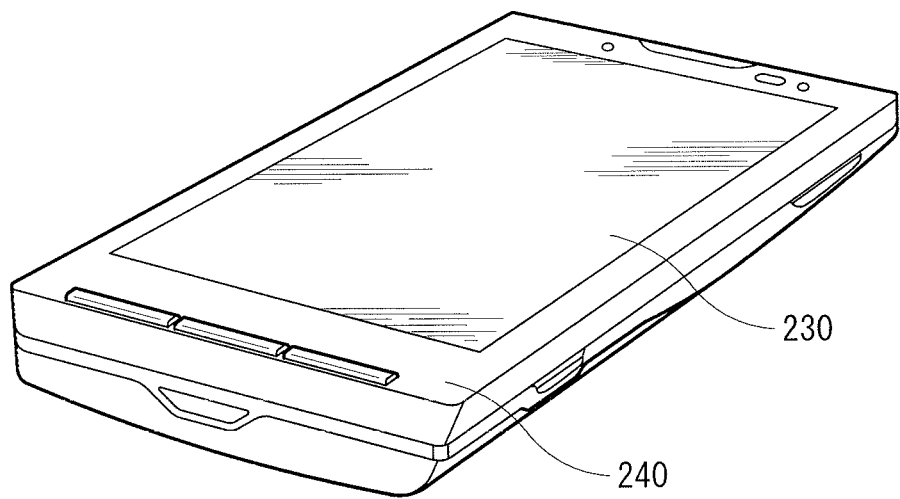
FIG. 36 is a perspective view illustrating an appearance of Application example 2 when viewed from front.

FIG. 36 illustrates an appearance of a smartphone to which the display unit of any of the above-described embodiments is applied. This smartphone may include, for example, a display section 230 and a non-display section 240. The display section 230 is configured using the display unit of any of the above-described embodiments.

Application Example 3

Figure 37:
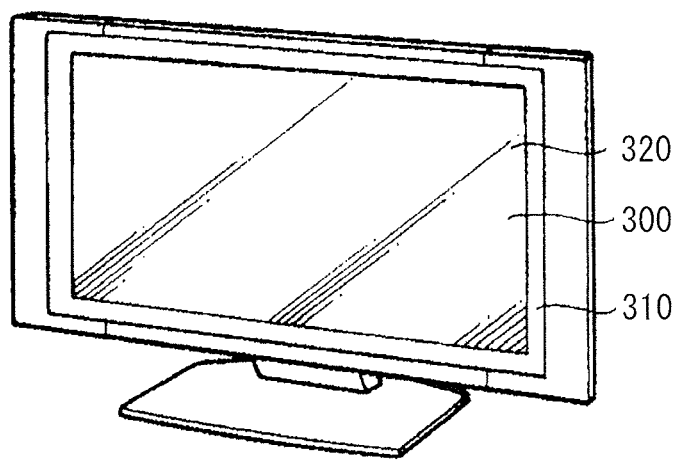
FIG. 37 is a perspective view illustrating an appearance of Application example 3.

FIG. 37 illustrates an appearance of a television apparatus to which the display unit of any of the above-described embodiments is applied. This television apparatus may include, for example, an image-display screen section 300 including a front panel 310 and a filter glass 320. The image-display screen section 300 is configured using the display unit of any of the above-described embodiments.

Application Example 4

Figure 38A:
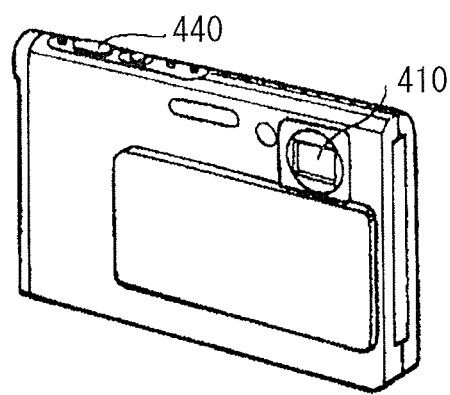
FIG. 38A is a perspective view illustrating an appearance of Application example 4 when viewed from front.
Figure 38B:
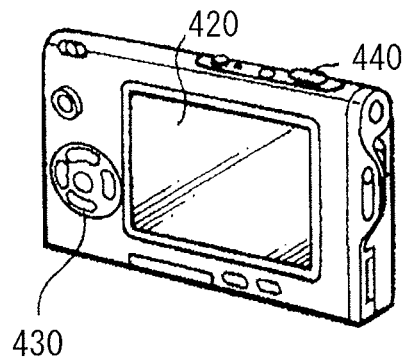
FIG. 38B is a perspective view illustrating an appearance of Application example 4 when viewed from back.

FIGS. 38A and 38B each illustrate an appearance of a digital camera to which the display unit of any of the above-described embodiments is applied. This digital camera may include, for example, a flash emitting section 410, a display section 420, a menu switch 430, and a shutter button 440. The display section 420 is configured using the display unit of any of the above-described embodiments.

Application Example 5

Figure 39:
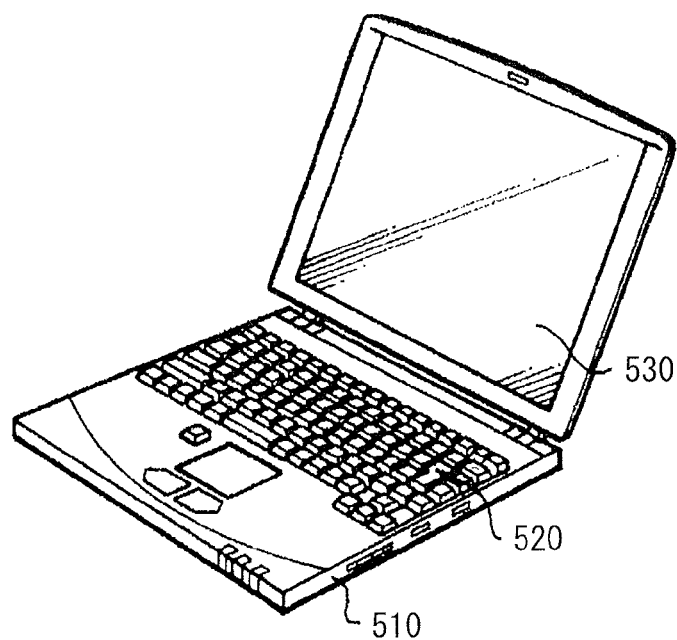
FIG. 39 is a perspective view illustrating an appearance of Application example 5.

FIG. 39 illustrates an appearance of a laptop personal computer to which the display unit of any of the above-described embodiments is applied. This laptop personal computer may include, for example, a main body section 510, a keyboard 520 provided to enter characters and the like, and a display section 530 displaying an image. The display section 530 is configured using the display unit of any of the above-described embodiments.

Application Example 6

Figure 40:
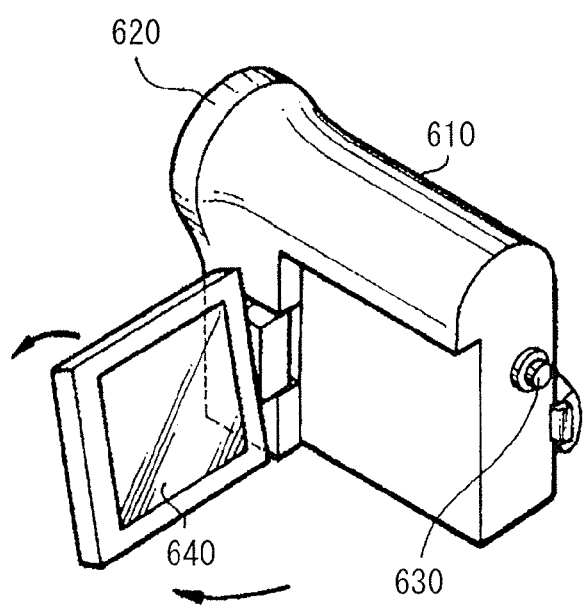
FIG. 40 is a perspective view illustrating an appearance of Application example 6.

FIG. 40 illustrates an appearance of a video camera to which the display unit of any of the above-described embodiments is applied. This video camera may include, for example, a main body section 610, a lens 620 disposed on a front face of this main body section 610 to shoot an image of a subject, a start/stop switch 630 used in shooting, and a display section 640. The display section 640 is configured using the display unit of any of the above-described embodiments.

Application Example 7

Figure 41A:
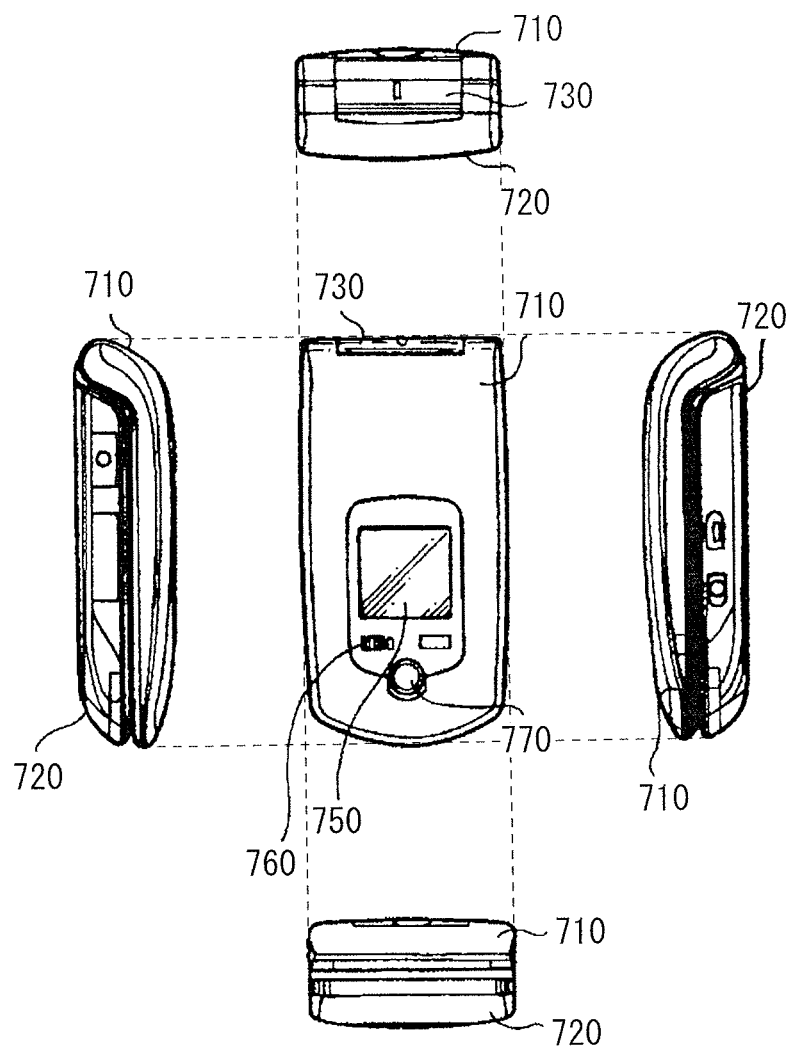
FIG. 41A is a diagram illustrating a closed state of Application example 7.
Figure 41B:
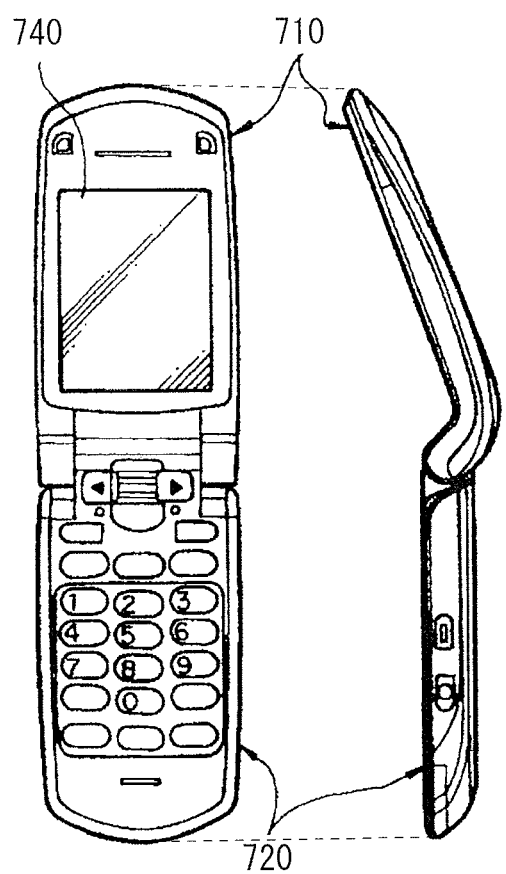
FIG. 41B is a diagram illustrating an open state of Application example 7.

FIGS. 41A and 41B each illustrate appearances of a mobile phone to which the display unit of any of the above-described embodiments is applied. This mobile phone may be, for example, a unit in which an upper housing 710 and a lower housing 720 are connected by a coupling section (a hinge section) 730, and may include a display 740, a sub-display 750, a picture light 760, and a camera 770. Of these components, the display 740 or the sub-display 750 is configured using the display unit of any of the above-described embodiments.

Figure 42:
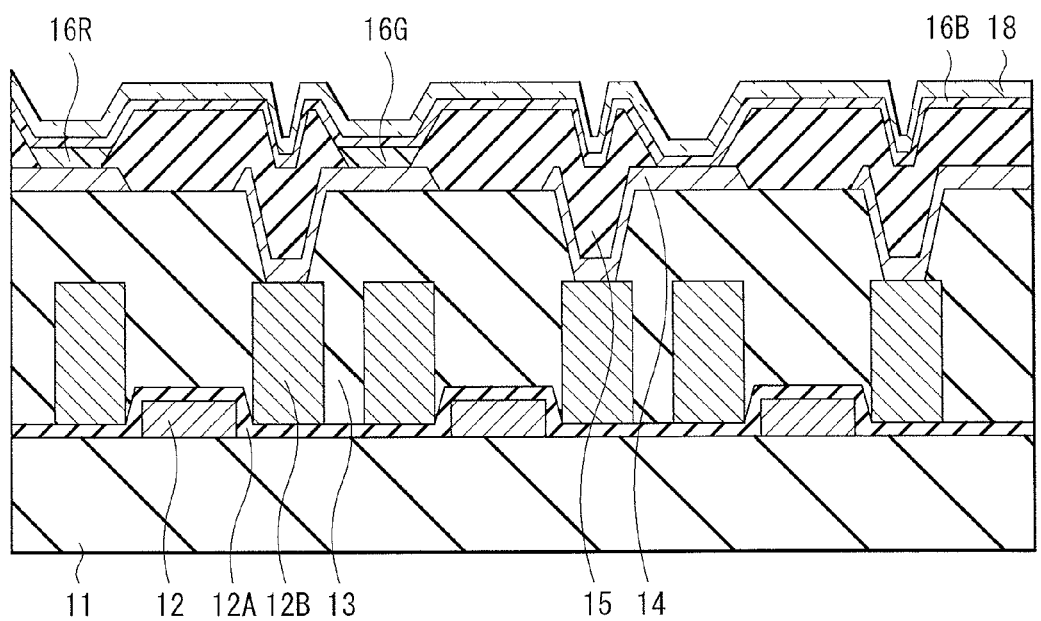
FIG. 42 is a cross-sectional diagram illustrating another example of an organic layer illustrated in FIG. 1, etc.

The present application has been described above with reference to some embodiments and modifications, but is not limited thereto and may be variously modified. For example, in the above-described embodiments and the like, the case in which all the organic light-emission devices 10R, 10G, and 10B include the common organic layer 16 has been described as an example. However, it may be sufficient that at least one organic layer 16 is common to the organic light-emission devices 10R, 10G, and 10B. For example, as illustrated in FIG. 42, an organic layer 16R and an organic layer 16G may be provided in the organic light-emission devices 10R and 10G, respectively, and an organic layer 16B may be provided to be common to the organic light-emission devices 10R, 10G, and 10B. Alternatively, the light emitting layer may be colored in different colors for each of the organic light-emission devices 10R, 10G, and 10B, and the hole injection layer and the like may be provided to be common to the organic light-emission devices 10R, 10G, and 10B.

Further, in the above-described embodiments and the like, the case in which the red light emitting layer, the green light emitting layer, and the blue light emitting layer are laminated to generate white light. However, the configuration of the light emitting layers may be of any type. For example, a blue light emitting layer and a yellow light emitting layer may be laminated.

In addition, in the above-described embodiments and the like, the case in which a red pixel, a green pixel, and a blue pixel are arranged by providing the red filter 23R, the green filter 23G, and the blue filter 23B as the color filter 23 has been described. However, a yellow pixel or a white pixel may be added to these pixels. This makes it possible to improve luminance.

Furthermore, in the above-described embodiments and the like, the case of providing the high-resistive layer 17 has been described. However, the organic light-emission devices 10R, 10G, and 10B may be configured without providing the high-resistive layer. Moreover, the overcoat layer 24 may also be omitted.

In addition, the materials and thicknesses, or the film formation methods and film formation conditions of the respective layers described in each of the embodiments and the like are not limitative. Other materials and thicknesses, or other film formation methods and film formation conditions may be adopted. Further, all the components of the above-described embodiments and the like may not be provided necessarily, and other components may be further provided.

It is possible to achieve at least the following configurations from the above-described example embodiments and the modifications of the disclosure.

(1) A display unit including:

a first substrate including a plurality of light-emission devices in a display region, the plurality of light-emission devices each including an organic layer between a first electrode and a second electrode;

a second substrate disposed to face the first substrate with the light-emission devices interposed therebetween;

a first peripheral electrode provided on the second substrate and positioned outside the display region;

a first wiring provided on the second substrate and configured to be electrically connected to the first peripheral electrode; and a first connection section configured to electrically connect the first wiring and each of the light-emission devices.

(2) The display unit according to (1), wherein the second electrode is provided between the organic layer and the second substrate to be common to the plurality of light-emission devices, and is electrically connected to the first connection section.

(3) The display unit according to (1) or (2), further including:

a second peripheral electrode provided on the second substrate and positioned outside the display region;

a second wiring provided on the second substrate and configured to be electrically connected to the second peripheral electrode; and a second connection section configured to electrically connect the second wiring to each of the light-emission devices.

(4) The display unit according to (3), wherein the second peripheral electrode is electrically connected to a control section configured to transmit a drive signal to each of the light-emission devices, and the first electrode is provided between the organic layer and the first substrate for each of the light-emission devices, and is electrically connected to the second connection section.

(5) The display unit according to (4), wherein the second connection section includes a conductor and an anisotropic conductive film, the conductor being provided outside the display region of the first substrate, and the anisotropic conductive film being provided between the conductor and the second wiring.

(6) The display unit according to (4) or (5), wherein the first electrode is electrically connected to the second connection section through a TFT provided on the first substrate.

(7) The display unit according to any one of (2) to (6), wherein one or more layers serving as the organic layer are provided to be common to the plurality of light-emission devices.

(8) The display unit according to any one of (2) to (7), wherein the organic layer includes a light emitting layer, and one or more layers serving as the light emitting layer are provided to be common to the plurality of light-emission devices.

(9) The display unit according to any one of (1) to (8), wherein light from the light emitting layer is extracted from the second substrate side.

(10) The display unit according to any one of (1) to (9), wherein the first connection section is provided in a non-light emission region between the light-emission devices next to each other.

(11) The display unit according to any one of (1) to (10), wherein the first connection section is configured of an electrically-conductive pillar.

(12) The display unit according to any one of (1) to (10), wherein the first connection section is configured of an electrically-conductive ball.

(13) The display unit according to any one of (1) to (10), wherein the first connection section is configured of electrically-conductive resin between the second electrode and the second substrate.

(14) The display unit according to (10), wherein the second substrate includes a plurality of color filters allowing light rays in wavelengths different from one another to pass therethrough, and in the first connection section, a projection section formed of the plurality of color filters allows the first wiring to be electrically connected to the light-emission devices.

(15) The display unit according to (10), wherein an insulating film is provided between the light-emission devices next to each other, and the second electrode is extended on the insulating film, and in the first connection section, the insulating film and the first wiring are in contact with each other with the second electrode interposed therebetween.

(16) An electronic apparatus including a display unit including, a first substrate including a plurality of light-emission devices in a display region, the plurality of light-emission devices each including an organic layer between a first electrode and a second electrode, a second substrate disposed to face the first substrate with the light-emission devices interposed therebetween, a first peripheral electrode provided on the second substrate and positioned outside the display region, a first wiring provided on the second substrate and configured to be electrically connected to the first peripheral electrode, and a first connection section configured to electrically connect the first wiring and each of the light-emission devices.

(17) A method of manufacturing a display unit, the method including:

forming a plurality of light-emission devices in a display region on a first substrate, the plurality of light-emission devices each including an organic layer between a first electrode and a second electrode;

forming a first wiring and a first peripheral electrode on a second substrate, the first peripheral electrode being provided outside the display region and being electrically connected to the first wiring; and disposing the second substrate to face the first substrate with the light-emission devices interposed therebetween, and electrically connecting the first wiring to each of the light-emission devices through the first connection section.

(18) The method according to (17), wherein after a second peripheral electrode is formed outside the display region of the first substrate, the second peripheral electrode is covered with a protective film, and after the light-emission devices are formed, the protective film is removed, and the second peripheral electrode is electrically connected to a control section configured to transmit a signal to each of the light-emission devices.

(19) The method according to (17), wherein after a conductor is formed outside the display region of the first substrate, the conductor is covered with a protective film, after the light-emission devices are formed, the protective film is removed, a second peripheral electrode is formed on the second substrate to be positioned outside the display region, and the conductor is electrically connected to a control section configured to transmit a signal to each of the light-emission devices through the second peripheral electrode.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display unit comprising:

a first substrate including a plurality of light-emission devices in a display region, the plurality of light-emission devices each including an organic layer between a first electrode and a second electrode;

a second substrate disposed to face the first substrate with the light-emission devices interposed therebetween;

a first peripheral electrode provided on the second substrate and positioned outside the display region;

a first wiring provided on the second substrate and configured to be electrically connected to the first peripheral electrode; and a first connection section provided on the second electrode and configured to electrically connect the first wiring and the light-emission devices, wherein the first connection section is provided in the display region.

2. The display unit according to claim 1, wherein the second electrode is provided between the organic layer and the second substrate to be common to the plurality of light-emission devices, and is electrically connected to the first connection section.

3. The display unit according to claim 2, wherein one or more layers serving as the organic layer are provided to be common to the plurality of light-emission devices.

4. The display unit according to claim 2, wherein the organic layer includes a light emitting layer, and one or more layers serving as the light emitting layer are provided to be common to the plurality of light-emission devices.

5. The display unit according to claim 1, further comprising:

a second peripheral electrode provided on the second substrate and positioned outside the display region;

a second wiring provided on the second substrate and configured to be electrically connected to the second peripheral electrode; and a second connection section configured to electrically connect the second wiring to each of the light-emission devices.

6. The display unit according to claim 5, wherein the second peripheral electrode is electrically connected to a control section configured to transmit a drive signal to each of the light-emission devices, and the first electrode is provided between the organic layer and the first substrate for each of the light-emission devices, and is electrically connected to the second connection section.

7. The display unit according to claim 6, wherein the second connection section includes a conductor and an anisotropic conductive film, the conductor being provided outside the display region of the first substrate, and the anisotropic conductive film being provided between the conductor and the second wiring.

8. The display unit according to claim 6, wherein the first electrode is electrically connected to the second connection section through a TFT provided on the first substrate.

9. The display unit according to claim 1, wherein light from the light emitting layer is extracted from the second substrate side.

10. The display unit according to claim 1, wherein the first connection section is provided in a non-light emission region between the light-emission devices next to each other.

11. The display unit according to claim 10, wherein the second substrate includes a plurality of color filters allowing light rays in wavelengths different from one another to pass therethrough, and in the first connection section, a projection section formed of the plurality of color filters allows the first wiring to be electrically connected to the light-emission devices.

12. The display unit according to claim 10, wherein an insulating film is provided between the light-emission devices next to each other, and the second electrode is extended on the insulating film, and in the first connection section, the insulating film and the first wiring are in contact with each other with the second electrode interposed therebetween.

13. The display unit according to claim 1, wherein the first connection section is configured of an electrically-conductive pillar.

14. The display unit according to claim 1, wherein the first connection section is configured of an electrically-conductive ball.

15. The display unit according to claim 1, wherein the first connection section is configured of electrically-conductive resin between the second electrode and the second substrate.

16. The display unit according to claim 1, further comprising a high-resistive layer provided between the organic layer and the second electrode.

17. The display unit according to claim 16, wherein the high-resistive layer has an electric resistance higher than each of the first electrode and the second electrode.

18. The display unit according to claim 17, wherein the high-resistive layer is configured to prevent occurrence of a short circuit between the first electrode and the second electrode.

19. The display unit according to claim 18, wherein the high-resistive layer includes at least one of niobium oxide, titanium oxide, molybdenum oxide, tantalum oxide, hafnium oxide, magnesium oxide, IGZO, a mixture of niobium oxide and titanium oxide, a mixture of titanium oxide and zinc oxide and a mixture of a silicon oxide and tin oxide.

20. An electronic apparatus comprising a display unit including, a first substrate including a plurality of light-emission devices in a display region, the plurality of light-emission devices each including an organic layer between a first electrode and a second electrode, a second substrate disposed to face the first substrate with the light-emission devices interposed therebetween, a first peripheral electrode provided on the second substrate and positioned outside the display region, a first wiring provided on the second substrate and configured to be electrically connected to the first peripheral electrode, and a first connection section provided on the second electrode and configured to electrically connect the first wiring and the light-emission devices, wherein the first connection section is provided in the display region.

21. A method of manufacturing a display unit, the method comprising:

forming a plurality of light-emission devices in a display region on a first substrate, the plurality of light-emission devices each including an organic layer between a first electrode and a second electrode;

forming a first wiring and a first peripheral electrode on a second substrate, the first peripheral electrode being provided outside the display region and being electrically connected to the first wiring; and disposing the second substrate to face the first substrate with the light-emission devices interposed therebetween, and electrically connecting the first wiring to each of the light-emission devices through a first connection section provided on the second electrode, wherein the first connection section is provided in the display region.

22. The method according to claim 21, wherein
after a second peripheral electrode is formed outside the display region of the first substrate, the second peripheral electrode is covered with a protective film, and
after the light-emission devices are formed, the protective film is removed, and the second peripheral electrode is electrically connected to a control section configured to transmit a signal to each of the light-emission devices.

23. The method according to claim 21, wherein
after a conductor is formed outside the display region of the first substrate, the conductor is covered with a protective film,
after the light-emission devices are formed, the protective film is removed,
a second peripheral electrode is formed on the second substrate to be positioned outside the display region, and
the conductor is electrically connected to a control section configured to transmit a signal to each of the light-emission devices through the second peripheral electrode.

* * * * *